(12) United States Patent
Ye

(10) Patent No.: US 11,799,261 B2
(45) Date of Patent: Oct. 24, 2023

(54) APPARATUS FOR AND METHOD OF OPTICAL COMPONENT ALIGNMENT

(71) Applicant: Cymer, LLC, San Diego, CA (US)

(72) Inventor: Hong Ye, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

(21) Appl. No.: 18/020,718

(22) PCT Filed: Aug. 10, 2021

(86) PCT No.: PCT/US2021/045324
§ 371 (c)(1),
(2) Date: Feb. 10, 2023

(87) PCT Pub. No.: WO2022/046402
PCT Pub. Date: Mar. 3, 2022

(65) Prior Publication Data
US 2023/0231352 A1    Jul. 20, 2023

Related U.S. Application Data

(60) Provisional application No. 63/072,390, filed on Aug. 31, 2020.

(51) Int. Cl.
*H01S 3/00* (2006.01)
*G02B 5/20* (2006.01)
(Continued)

(52) U.S. Cl.
CPC ............ *H01S 3/0057* (2013.01); *G02B 5/208* (2013.01); *G03F 7/7055* (2013.01); *G03F 7/70141* (2013.01)

(58) Field of Classification Search
CPC ........ H01S 3/0085; H01S 3/04; H01S 3/0401; H01S 3/10038; H01S 3/10046;
(Continued)

(56) References Cited

U.S. PATENT DOCUMENTS 7,369,597 B2    5/2008  Smith et al.
10,447,001 B2   10/2019 Taniyama et al.
(Continued)

FOREIGN PATENT DOCUMENTS

EP    1502334 B1    12/2009
TW    200702720 A    1/2007

OTHER PUBLICATIONS

"Research on thermal stability of monolithic near-infrared Doppler asymmetric spatial heterodyne interferometer", Chang et al., Optical Engineering, vol. 62, Issue 1, Jan. 2023 (Year: 2023).*
Jens Weckesser, European International Searching Authority, International Search Report and Written Opinion, counterpart PCT Application No. PCT/US2021/045324, dated Dec. 13, 2021, 11 total pages.

*Primary Examiner* — Derek S. Chapel
*Assistant Examiner* — Adam W Booher
(74) *Attorney, Agent, or Firm* — DiBerardino McGovern IP Group LLC

(57) ABSTRACT

Apparatus for and method of aligning optical components such as mirrors to facilitate proper beam alignment using an image integration optical system is used to integrate images from multiple optical features such as from both left mirror bank and right mirror bank to present the images simultaneously to the camera system. A fluorescent material may be used to render a beam footprint visible and the relative positions of the footprint and an alignment feature may be used to align the optical feature.

22 Claims, 19 Drawing Sheets

(51) Int. Cl.
*G03F 7/00* (2006.01)
*G03F 7/20* (2006.01)

(58) Field of Classification Search
CPC ............... H01S 5/02218; H01S 5/0222; H01S 5/02232; H01S 5/02257; H01S 5/024–02492; H01S 5/06835; H01S 3/0057; H01S 3/005; G02B 7/008; G02B 17/008; G02B 26/001; G02B 5/208; G02B 5/08; G02B 5/0891; G02B 17/004; G02B 17/0864; G02B 17/0892; G02B 7/182; G02B 7/1822–1828; G03F 7/70141; G03F 7/7055; G03F 7/70041; G03F 7/70908; G03F 7/70025
USPC ............................................. 372/23, 25, 30
See application file for complete search history.

(56) References Cited

U.S. PATENT DOCUMENTS

| | | | |
|---|---|---|---|
| 2003/0091087 A1 | 5/2003 | Ershov et al. | |
| 2009/0080476 A1 | 3/2009 | Partlo et al. | |
| 2016/0248219 A1 | 8/2016 | Wakabayashi et al. | |
| 2016/0305761 A1* | 10/2016 | Girshovitz | G01B 9/0203 |
| 2016/0334618 A1* | 11/2016 | Hargis | H01S 3/2391 |
| 2018/0123308 A1 | 5/2018 | Taniyama et al. | |
| 2019/0235367 A1* | 8/2019 | Yanagisawa | H04N 5/7441 |
| 2019/0285904 A1* | 9/2019 | Kim | G02B 30/56 |

* cited by examiner

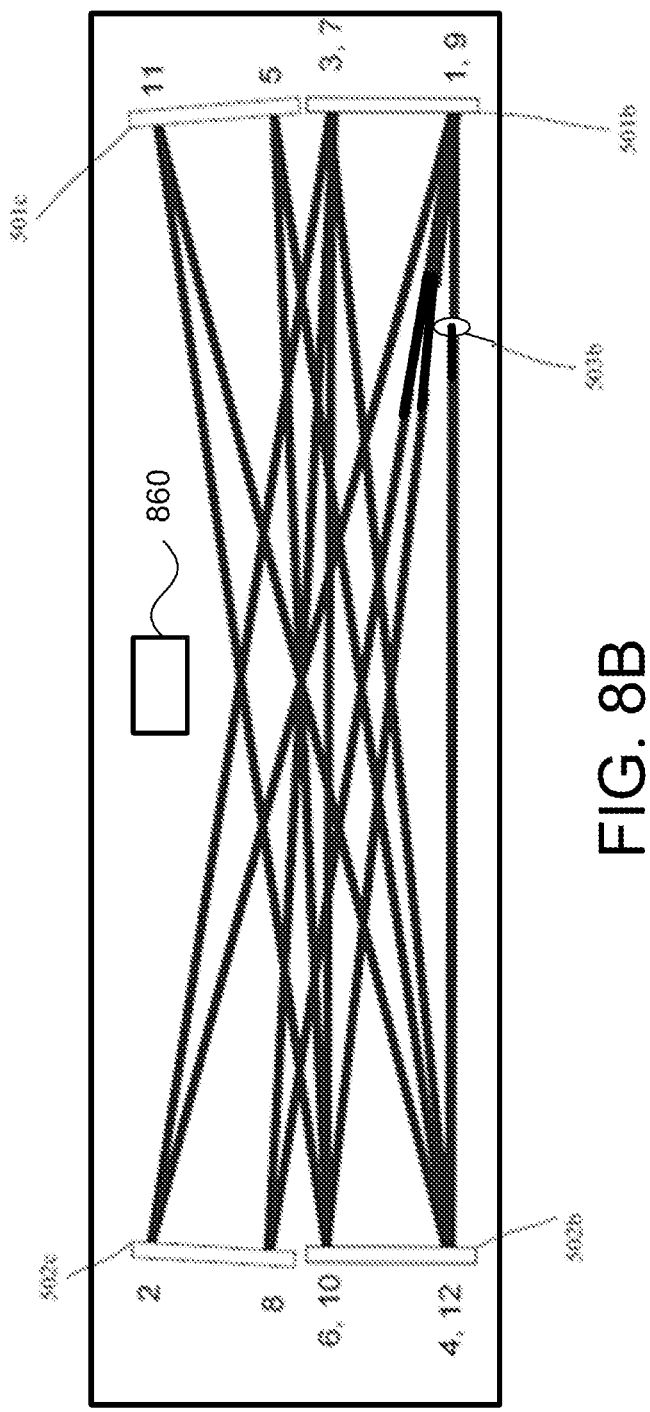

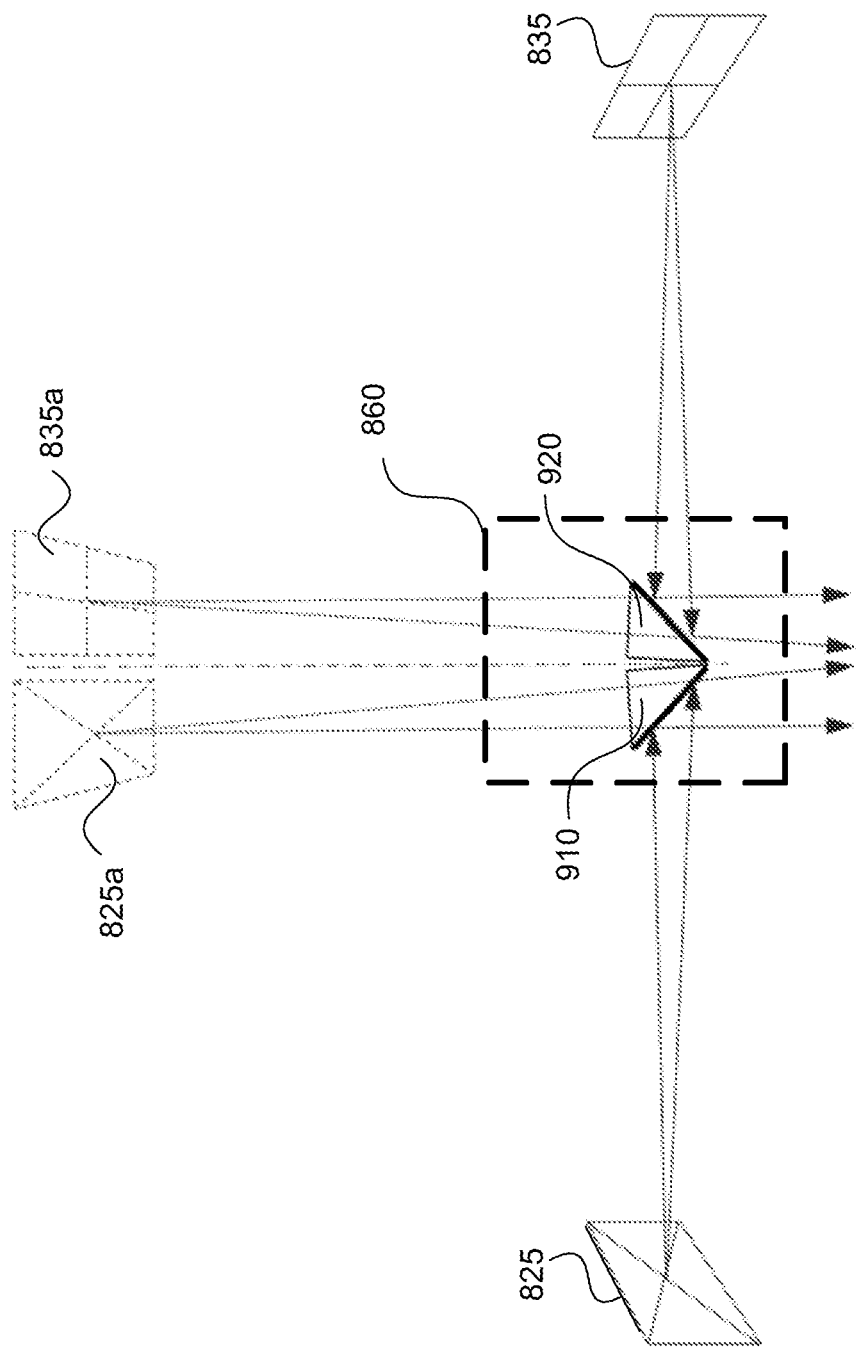

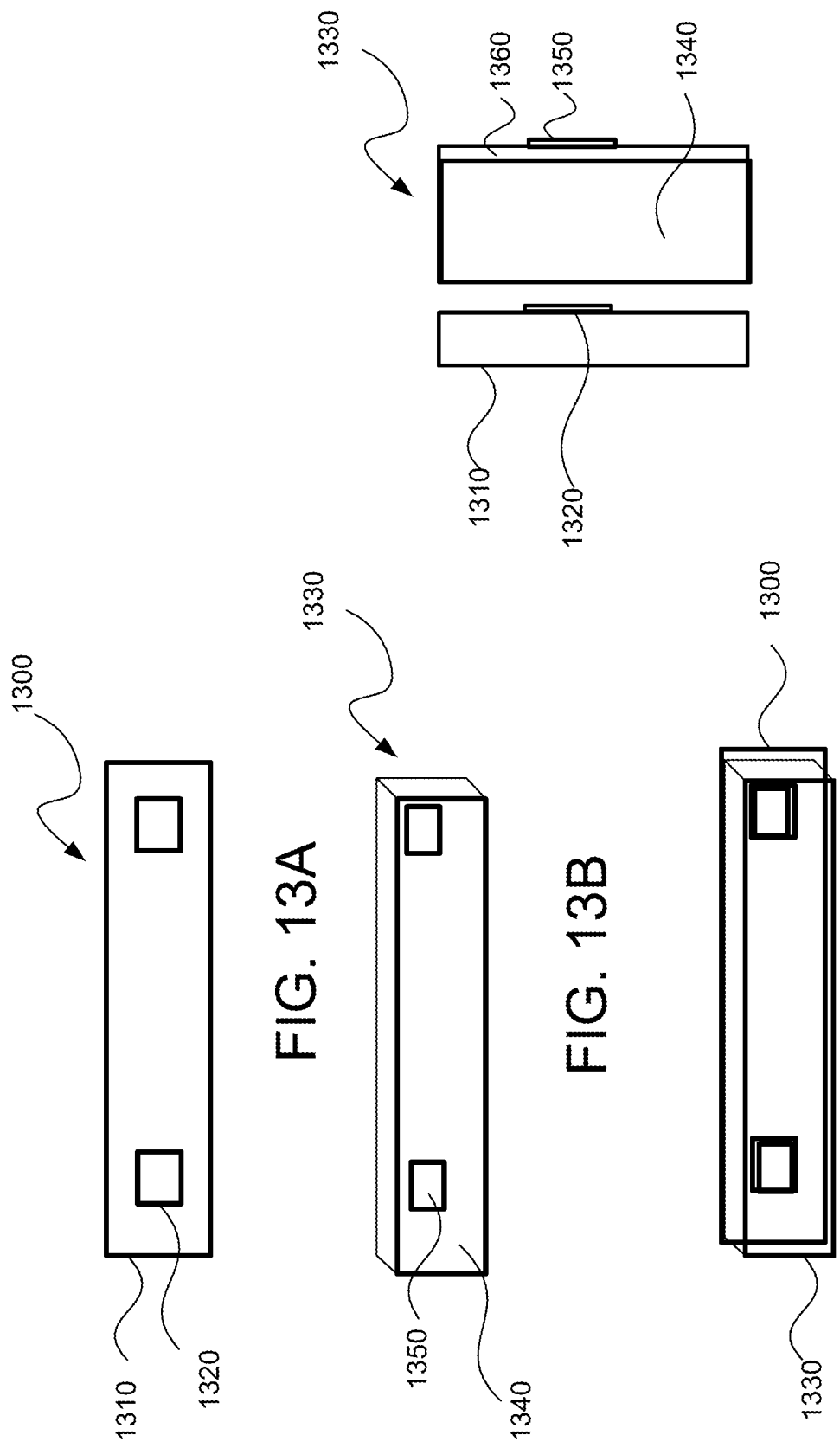

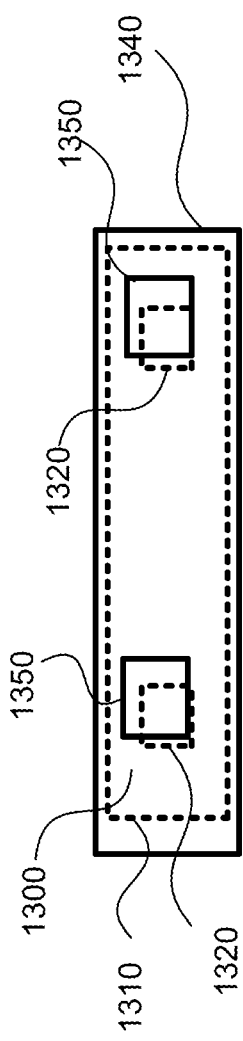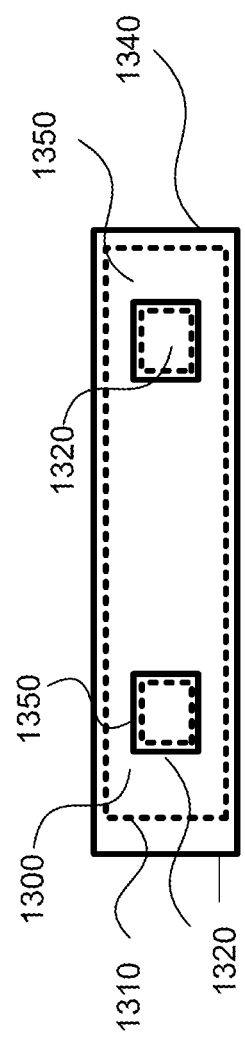

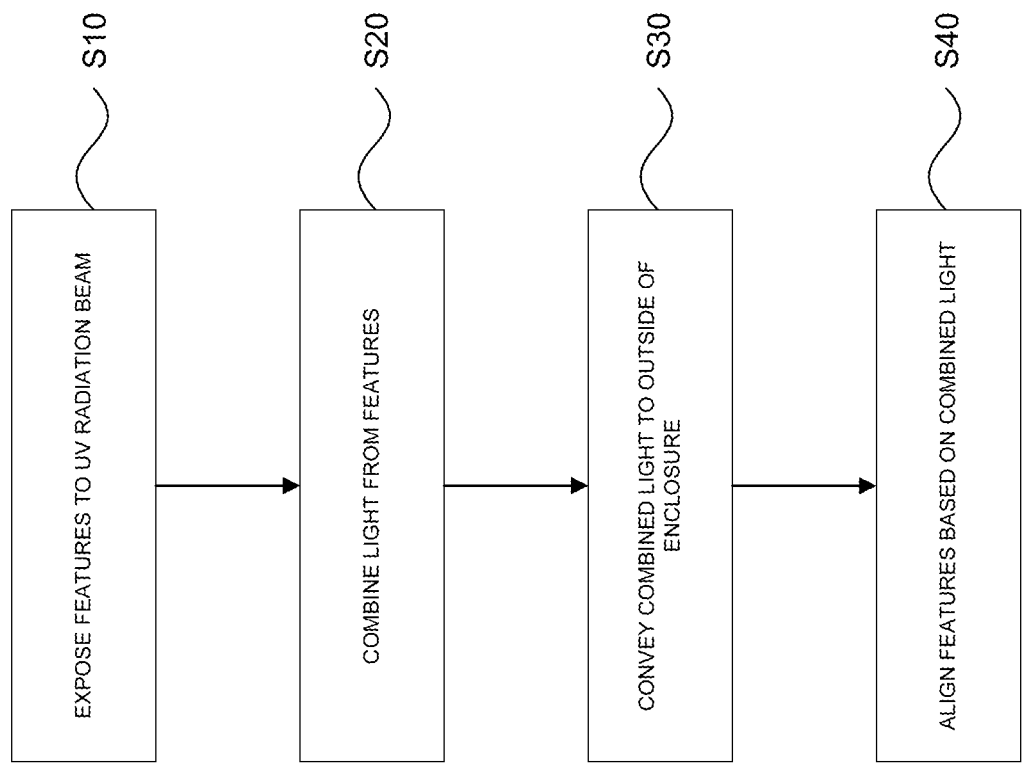

APPARATUS FOR AND METHOD OF OPTICAL COMPONENT ALIGNMENT

CROSS REFERENCE TO RELATED APPLICATIONS

This application claims priority to U.S. Application No. 63/072,390, filed Aug. 31, 2020, titled APPARATUS FOR AND METHOD OF OPTICAL COMPONENT ALIGNMENT, which is incorporated herein in its entirety by reference.

FIELD

The present disclosure relates to systems and methods for aligning optical components for use, for example, in a lithographic apparatus, and particularly to components in optical pulse stretchers useful for lengthening the pulse of the output of a laser source.

BACKGROUND

A lithographic apparatus applies a desired pattern onto a substrate such as a wafer of semiconductor material, usually onto a target portion of the substrate. A patterning device, which is alternatively referred to as a mask or a reticle, may be used to generate a circuit pattern to be formed on an individual layer of the wafer. Transfer of the pattern is typically accomplished by imaging onto a layer of radiation-sensitive material (resist) provided on the substrate. In general, a single substrate will contain adjacent target portions that are successively patterned.

Lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate. Herein, for the sake of simplicity, both steppers and scanners will be referred to simply as scanners.

The light source used to illuminate the pattern and project it onto the substrate can be of any one of a number of configurations. Deep ultraviolet excimer lasers commonly used in lithography systems include the krypton fluoride (KrF) laser at 248 nm wavelength and the argon fluoride (ArF) laser at 193 nm wavelength. The laser source can include an optical pulse stretcher for lengthening the pulse of the output of a high power gas discharge laser system.

Newer requirements for lithography scanner performance necessitate a longer pulse length, measured in terms of the time integral square (TIS) of the pulse length. For example, improving the Edge Placement Error (EPE) of a chip feature requires a longer TIS. An optical pulse stretcher (OPuS) is used to stretch the pulses to achieve the desired TIS. Increasing TIS requires a larger OPuS. Increasing the size of the OPuS makes is even more critical that the components of the OPuS are in proper optical alignment.

A conventional method of aligning the components of an OPuS entails opening the OPuS enclosure and physically positioning a target card near the optical surface of a component being aligned. The incoming beam is then aligned based on the landing position of the beam of the target card. The target card is then shifted to the next optical component requiring alignment and so on until all of the optical components requiring alignment have been properly aligned.

This alignment process, which may be referred to as open beam paper target alignment, requires opening up the sealed laser enclosure for card placement. It entails the risks of open beam operation and must be executed very carefully to avoid exposing the skin of the individual performing the alignment to UV radiation. It is also time consuming and requires an extensive amount of manipulation and other manual operation. It exposes the optical surfaces being aligned to contamination and can result in a reduction of optical life of critical optical component. It is also difficult to achieve accurate alignment due to the complexity of establishing the beam alignment target and subjective judgment of beam position.

SUMMARY

The following presents a concise summary of one or more embodiments in order to provide a basic understanding of the embodiments. This summary is not an extensive overview of all contemplated embodiments and is not intended to identify key or critical elements of all embodiments nor delineate the scope of any or all embodiments. Its sole purpose is to present some concepts of one or more embodiments in a simplified form as a prelude to the more detailed description that is presented later.

According to an aspect of an embodiment, a camera system is used to monitor the beam position on OpuS components such as mirrors to facilitate proper beam alignment. In some embodiments an image integration optical system is used to integrate images from multiple optical features such as from both left mirror bank and right mirror bank to present the images simultaneously to the camera system. This simplifies the design and avoids the cost of having multiple cameras to inspect the features separately. According to an aspect of an embodiment, the camera system is installed outside the purge volume of OPuS enclosure to mitigate the risks of open beam operation and avoid breaking purge. As used herein, the term "camera" is intended to encompass any device, system, or arrangement for capturing (converting) an image.

According to aspects of an embodiment, during alignment the landing position of the beam as revealed by a "florescence footprint" is positioned to be coincident with or overlap an alignment feature of a component being aligned. For example, where the optical component is a dichroic mirror within the OPuS, the alignment feature may be placed on the back support plate through the dichroic mirror to facilitate beam positioning.

Thus, according to some embodiments, use of the camera system minimizes the amount of open beam operation required during alignment. This significantly improves the safety of the alignment procedure. Also, the non-contact nature of this alignment system reduces the risks inherent in direct close optics handling including the risk of surface contamination. The system also makes possible a significant reduction in the field service time of the OPuS module due to elimination of the need to open the enclosure and break purge, and of manual target positioning.

According to an aspect of an embodiment there is disclosed an optical component comprising a sealed enclosure, the sealed enclosure including a window transparent to visible light, a first optical feature positioned at a first position within the enclosure, a second optical feature positioned at a second position within the enclosure, and an image integration module arranged to receive first optical feature light from the first optical feature and second optical feature light from the second optical feature and adapted to redirect the first optical feature light and the second optical feature light through the window to form an image from the first optical feature light collocated with an image from the second optical feature light. The optical component may be an optical pulse stretcher. The first optical feature may comprise a first mirror and the second optical feature may comprise a second mirror. The first mirror may comprise a first concave dichroic mirror and the second mirror may comprise a second concave dichroic mirror. The first optical feature and the second optical feature may be positioned substantially symmetrically with respect to the image integration module.

According to another aspect of an embodiment the image integration module may comprise a first reflective surface arranged to redirect light from the first optical feature and a second reflective surface arranged to redirect light from the second optical surface. The first reflective surface may comprise a first prism reflective surface of a first prism and the second reflective surface may comprise a second prism reflective surface of a second prism. The image integration module may comprise a prism having a first reflective surface oriented toward the first optical feature and a second reflective surface oriented toward the second optical feature. The image integration module may comprise two flat beveled mirrors.

According to another aspect of an embodiment the optical component may further comprise a third optical feature positioned at a third position within the enclosure and a fourth optical feature positioned at a fourth position within the enclosure, and the image integration module may be arranged to receive third optical feature light from the third optical feature and fourth optical feature light from the fourth optical feature and adapted to combine and redirect the third optical feature light and the fourth optical feature light through the window to form an image from the third optical feature light adjacent to an image from the fourth optical feature light.

According to another aspect of an embodiment the optical component may further comprise a camera system arranged to receive the first optical feature light and the second optical feature light through the window. The camera system may comprise a lens system arranged to receive the first optical feature light and the second optical feature light through the window and a camera arranged to receive the first optical feature light and the second optical feature light from the lens system. The optical component as may further comprise a folding mirror optically positioned between the image integration module and the window for turning an optical path of the first optical feature light and the second optical feature light.

According to another aspect of an embodiment at least one of the first optical feature and the second optical feature may be adjustable and may further comprise an actuator mechanically coupled to the at least one of the first optical feature and the second optical feature to adjust an orientation of the at least one of the first optical feature and the second optical feature.

According to another aspect of an embodiment the first optical feature may comprise a first fluorescent material and a first alignment feature and the second optical feature may comprise a second fluorescent material and a second alignment feature. The first optical feature may comprise a first mirror comprising a first substrate transparent to visible light and first reflective coating that is reflective to UV radiation and a first mirror support, and the second optical feature may comprise a second mirror comprising a second substrate transparent to visible light and second reflective coating that is reflective to UV radiation and a second mirror support. The first mirror support may comprise a first alignment feature on a front surface of the first mirror support and the second mirror support may comprise a second alignment feature on a front surface of the second mirror support. The first alignment feature may correspond to a position of an aligned beam footprint on the first mirror and the second alignment feature may correspond to a position of an aligned beam footprint on the second mirror.

According to another aspect of an embodiment the first optical feature may comprise a first reflective coating including the first fluorescent material and the second optical feature may comprise a second reflective coating including the second fluorescent material. The first fluorescent material may be provided on a back surface of the first substrate and the second fluorescent material may be provided on a back surface of the second substrate. The first fluorescent material may be provided on a front surface of the first mirror support and the second fluorescent material may be provided on a front surface of the second mirror support. The first mirror support may comprise the first fluorescent material and the second mirror support may comprise the second fluorescent material.

According to another aspect of an embodiment there is disclosed an optical component comprising a sealed enclosure, the sealed enclosure including a window transparent to visible light, a first optical feature positioned within a first field of view within the enclosure, a second optical feature positioned within the first field of view within the enclosure, and an image integration module arranged to receive first field of view light from the first field of view and adapted to combine and redirect the first field of view light through the window, and the image integration module may comprise a planar mirrored surface inclined with respect to a line passing through a center of the planar mirrored surface and substantially parallel to the first field of view by an angle θ given by the relationship $$\theta = 45 + \left[ \mathrm{atan}\left[ \frac{\frac{h}{2} - \frac{w}{2\sqrt{2}}}{s} \right] - \mathrm{atan}\left( \frac{d}{s} \right) \right] / 2.$$

where h is a height of the first field of view, d is a vertical distance between the center of the first field of view to the center of the planar mirrored surface, and s is a horizontal distance between the first field of view and the center of the planar mirrored surface.

According to another aspect of an embodiment there is disclosed a method of aligning a plurality of optical features arranged in sealed enclosure having a window, the method comprising combining light from each of the optical features to produce a combined light signal, directing the combined light signal out of the enclosure through the window, and aligning at least some of the plurality of optical features based at least in part on the combined light signal. The method may further comprise imaging the combined light signal after directing the combined light signal out of the enclosure through the window using a camera system positioned outside of the sealed enclosure and arranged to receive the combined light signal. Each of the plurality of optical features may comprise an alignment feature and a fluorescent material arranged to generate a visible footprint of a UV beam impinging on the optical feature and the method may further comprise, before combining light from each of the optical features to produce a combined light signal, exposing each of the optical features to a beam of UV radiation, and generating an illuminated footprint of the beam of UV radiation on each of the optical features, and aligning at least some of the plurality of optical features based at least in part on the combined light signal may comprise aligning at least some of the plurality of optical features based at least in part on a positional relationship of the illuminated footprint and the alignment feature for each optical feature. The aligning may comprise adjusting of one or more of the plurality of optical features. Adjusting one or more of the plurality of optical features may comprise manually operating one or more actuators respectively mechanically coupled to the one or more of the plurality of optical features. Adjusting one or more of the plurality of optical features may comprise supplying a signal to actuate one or more motor driven actuators respectively mechanically coupled to the one or more of the plurality of optical features. Adjusting one or more of the plurality of optical features may comprise adjusting an orientation of one or more of the plurality of optical features.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the methods and systems of embodiments of the invention by way of example, and not by way of limitation. Together with the detailed description, the drawings further serve to explain the principles of and to enable a person skilled in the relevant art(s) to make and use the methods and systems presented herein. In the drawings, like reference numbers indicate identical or functionally similar elements.

FIGS. 8A and 8B are diagrams showing a system for aligning optical features according to an aspect of the disclosed subject matter.

FIG. 9B is a diagram showing image collocation in a system for aligning optical features according to an aspect of the disclosed subject matter.

FIGS. 13A, 13B, 13C, and 13D show aspects of the structure of optical features according to aspects of the disclosed subject matter.

FIGS. 15A and 15B show the relative positioning of a UV footprint and an alignment mark before and after an alignment process, respectively, according to an aspect of the disclosed subject matter.

FIG. 16 is a flow chart illustrating a method of aligning optical features in optical component according to an aspect of the disclosed subject matter.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", "an exemplary embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper," "left," "right" and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
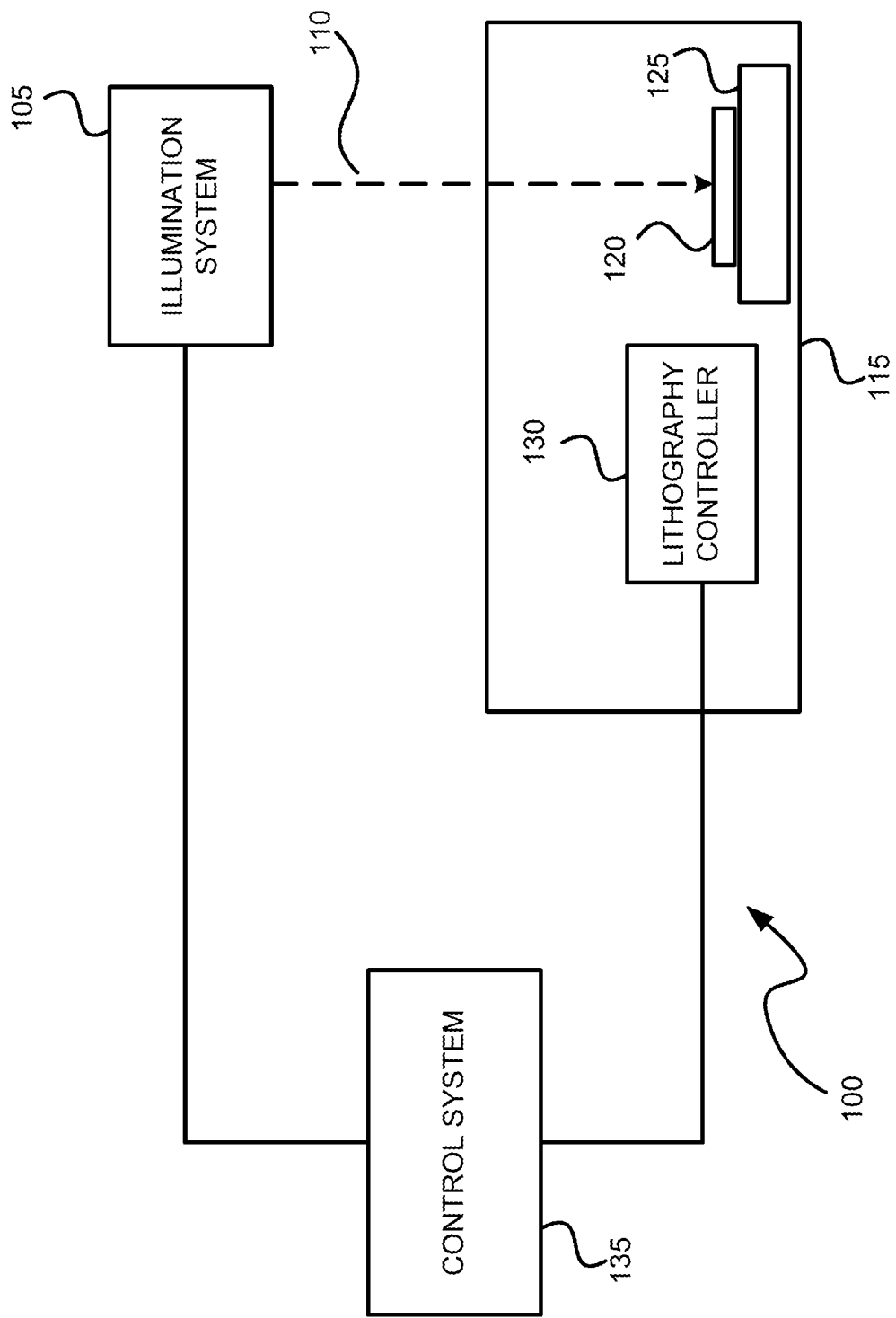
FIG. 1 shows a schematic, not to scale, view of an overall broad conception of a photolithography system according to an aspect of the disclosed subject matter.

Before describing specific embodiments in more detail, it is instructive to present an example environment in which embodiments of the present invention may be implemented. Referring to FIG. 1, a photolithography system 100 includes an illumination system 105. As described more fully below, the illumination system 105 includes a light source that produces a pulsed light beam 110 and directs it to a photolithography exposure apparatus or scanner 115 that patterns microelectronic features on a wafer 120. The wafer 120 is placed on a wafer table 125 constructed to hold wafer 120 and connected to a positioner (not shown) configured to accurately position the wafer 120 in accordance with certain parameters.

The photolithography system 100 uses a light beam 110 having a wavelength in the deep ultraviolet (DUV) range, for example, with wavelengths of 248 nanometers (nm) or 193 nm. The minimum size of the microelectronic features that can be patterned on the wafer 120 depends on the wavelength of the light beam 110, with a lower wavelength permitting a smaller minimum feature size. When the wavelength of the light beam 110 is 248 nm or 193 nm, the minimum size of the microelectronic features can be, for example, 50 nm or less. The bandwidth of the light beam 110 can be the actual, instantaneous bandwidth of its optical spectrum (or emission spectrum), which contains information on how the optical energy of the light beam 110 is distributed over different wavelengths. The scanner 115 includes an optical arrangement having, for example, one or more condenser lenses, a mask, and an objective arrangement. The mask is movable along one or more directions, such as along an optical axis of the light beam 110 or in a plane that is perpendicular to the optical axis. The objective arrangement includes a projection lens and enables the image transfer to occur from the mask to the photoresist on the wafer 120. The illumination system 105 adjusts the range of angles for the light beam 110 impinging on the mask. The illumination system 105 also homogenizes (makes uniform) the intensity distribution of the light beam 110 across the mask.

The scanner 115 can include, among other features, a lithography controller 130, air conditioning devices, and power supplies for the various electrical components. The lithography controller 130 controls how layers are printed on the wafer 120. The lithography controller 130 includes a memory that stores information such as process recipes. A process program or recipe determines the length of the exposure on the wafer 120 based on, for example, the mask used as well as other factors that affect the exposure. During lithography, a plurality of pulses of the light beam 110 illuminate the same area of the wafer 120 to constitute an illumination dose.

The photolithography system 100 also preferably includes a control system 135. In general, the control system 135 includes one or more of digital electronic circuitry, computer hardware, firmware, and software. The control system 135 also includes memory which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks.

The control system 135 can also include one or more input devices (such as a keyboard, touch screen, microphone, mouse, hand-held input device, etc.) and one or more output devices (such as a speaker or a monitor). The control system 135 may also include one or more programmable processors, and one or more computer program products tangibly embodied in a machine-readable storage device for execution by one or more programmable processors. The one or more programmable processors can each execute a program of instructions to perform desired functions by operating on input data and generating appropriate output. Generally, the processors receive instructions and data from the memory. Any of the foregoing may be supplemented by, or incorporated in, specially designed ASICs (application-specific integrated circuits). The control system 135 can be centralized or be partially or wholly distributed throughout the photolithography system 100.

Figure 2:
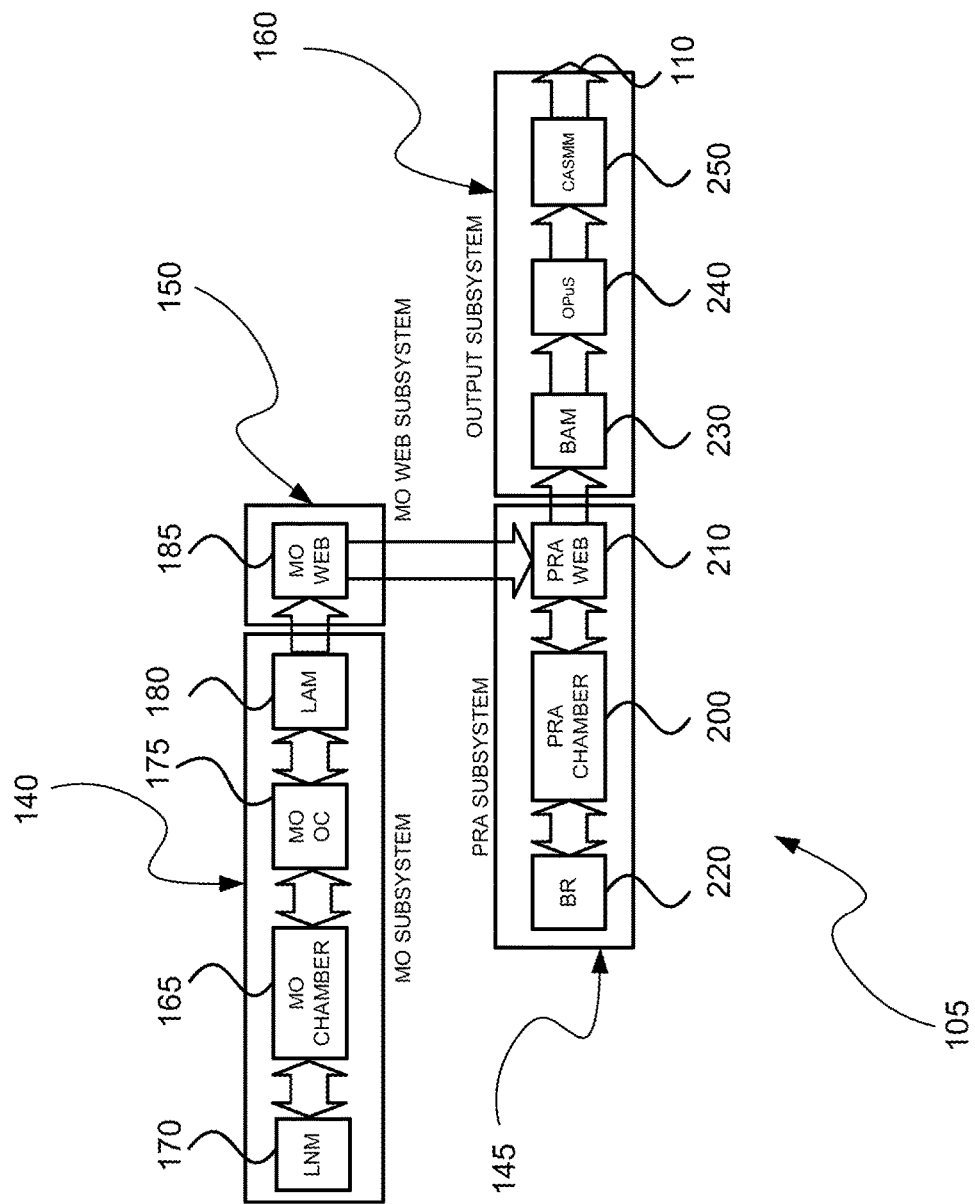
FIG. 2 shows a schematic, not to scale, view of an overall broad conception of a laser system used in a lithography system according to an aspect of the disclosed subject matter.

Referring to FIG. 2, an exemplary laser source system within the illumination system 105 is a pulsed laser source that produces a pulsed laser beam as the light beam 110. FIG. 2 shows illustratively and in block diagram a gas discharge laser system according to an embodiment of certain aspects of the disclosed subject matter. The gas discharge laser system may include, e.g., a solid state or gas discharge seed laser system 140, an amplification stage, e.g., a power ring amplifier ("PRA") stage 145, relay optics 150 and laser system output subsystem 160. The seed system 140 may include, e.g., a master oscillator ("MO") chamber 165.

The seed laser system 140 may also include a master oscillator output coupler ("MO OC") 175, which may comprise a partially reflective mirror, forming with a reflective grating (not shown) in a line narrowing module ("LNM") 170, an oscillator cavity in which the seed laser 140 oscillates to form the seed laser output pulse, i.e., forming a master oscillator ("MO"). The system may also include a line-center analysis module ("LAM") 180. The LAM 180 may include an etalon spectrometer for fine wavelength measurement and a coarser resolution grating spectrometer. A MO wavefront engineering box ("WEB") 185 may serve to redirect the output of the MO seed laser system 140 toward the amplification stage 145, and may include, e.g., beam expansion with, e.g., a multi prism beam expander (not shown) and coherence busting, e.g., in the form of an optical delay path (not shown).

The amplification stage 145 may include, e.g., a PRA lasing chamber 200, which may also be an oscillator, e.g., formed by seed beam injection and output coupling optics (not shown) that may be incorporated into a PRA WEB 210 and may be redirected back through the gain medium in the chamber 200 by a beam reverser 220. The PRA WEB 210 may incorporate a partially reflective input/output coupler (not shown) and a maximally reflective mirror for the nominal operating wavelength (e.g., at around 193 nm for an ArF system) and one or more prisms.

A bandwidth analysis module ("BAM") 230 at the output of the amplification stage 145 may receive the output laser light beam of pulses from the amplification stage and pick off a portion of the light beam for metrology purposes, e.g., to measure the output bandwidth and pulse energy. The laser output light beam of pulses then passes through an optical pulse stretcher ("OPuS") 240 and an output combined autoshutter metrology module ("CASMM") 250, which may also be the location of a pulse energy meter. One purpose of the OPuS 240 may be, e.g., to convert a single output laser pulse into a pulse train. Secondary pulses created from the original single output pulse may be delayed with respect to each other. By distributing the original laser pulse energy into a train of secondary pulses, the effective pulse length of the laser can be expanded and at the same time the peak pulse intensity reduced. The OPuS 240 can thus receive the laser beam from the PRA WEB 210 via the BAM 230 and direct the output of the OPuS 240 to the CASMM 250. Other suitable arrangements may be used in other embodiments.

The PRA lasing chamber 200 and the MO 165 are configured as chambers in which electrical discharges between electrodes may cause lasing gas discharges in a lasing gas to create an inverted population of high energy molecules, including, e.g., Ar, Kr, and/or Xe, to produce relatively broad band radiation that may be line narrowed to a relatively very narrow bandwidth and center wavelength selected in a line narrowing module ("LNM") 170, as is known in the art.

Typically, the tuning takes place in the LNM. A typical technique used for line narrowing and tuning of lasers is to provide a window at the back of the laser's discharge cavity through which a portion of the laser beam passes into the LNM. There, the portion of the beam is expanded with a prism beam expander and directed to a grating which reflects a narrow selected portion of the laser's broader spectrum back into the discharge chamber where it is amplified. The laser is typically tuned by changing the angle at which the beam illuminates the grating using an actuator such as, for example, a piezoelectric actuator.

In operation, the OPuS 240 stretches the excimer or other gas discharge laser, e.g., a molecular fluorine gas discharge laser, having a given pulse duration and TIS to a longer pulse having several peaks and a larger TIS.

Figure 3:
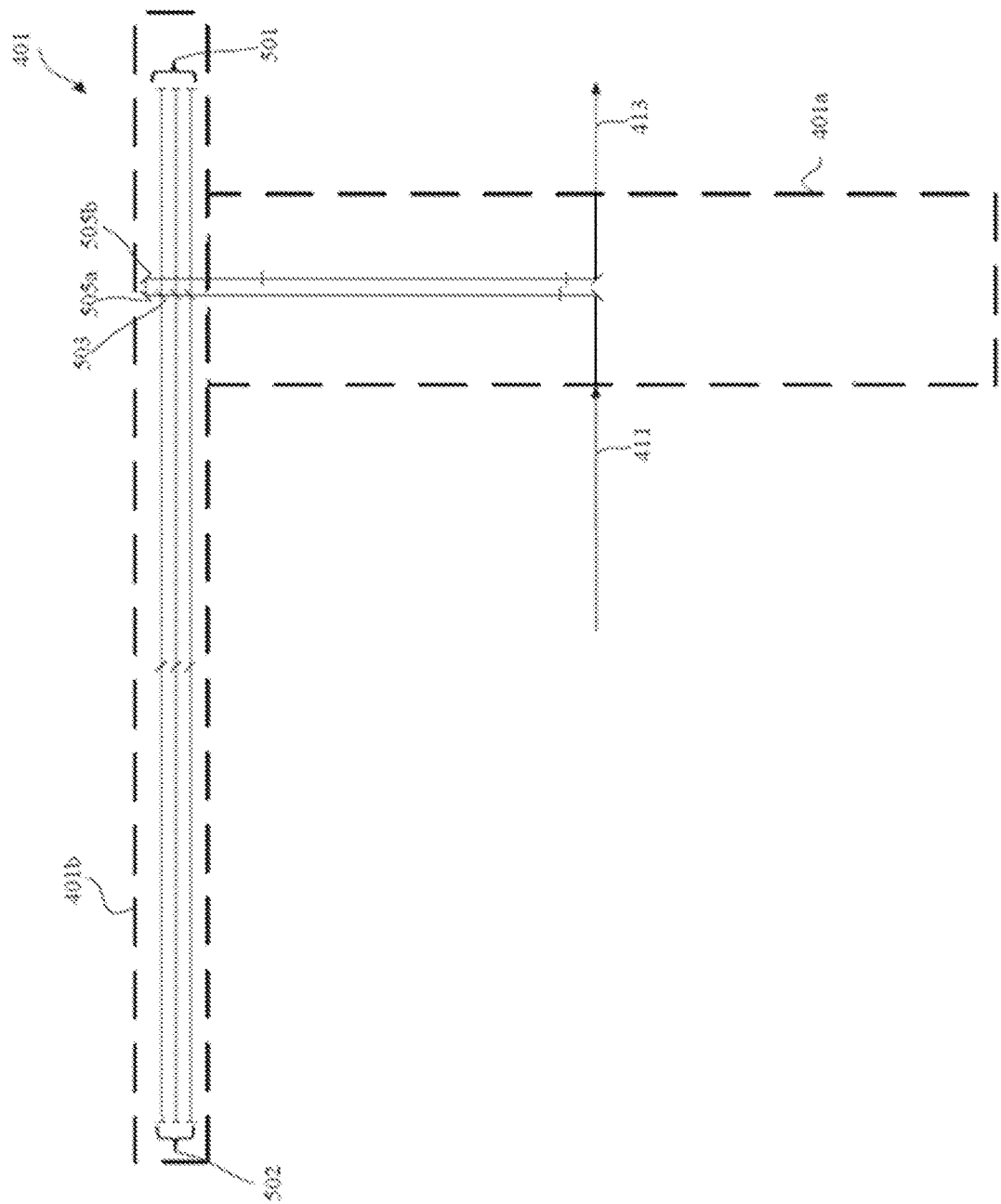
FIG. 3 is a diagram of an optical pulse stretcher according to an aspect of the disclosed subject matter.

FIG. 3 is a schematic diagram of front view of an example of an optical pulse stretcher 401 having first optical pulse stretcher 401a and second optical pulse stretcher 401b, according to some embodiments of the present disclosure. The optical pulse stretcher 401 receives input beam pulse 411 and stretches it to output a stretched output beam pulse 413.

According to some embodiments, and as discussed in more detail below, second optical pulse stretcher 401b can include two or more (for example, three) stages of confocal optical pulse stretchers. In some examples, these three stages of confocal optical pulse stretcher can be positioned approximately parallel to each other in second optical pulse stretcher 401b. In some embodiments, second optical pulse stretcher 401b can be positioned perpendicular or approximately perpendicular to first optical pulse stretcher 401a. In other words, in some embodiments, first optical pulse stretcher 401a (e.g., an orthogonal optical pulse stretcher that may be positioned vertically) is positioned perpendicular or approximately perpendicular to the two or more (for example, three) stages of confocal optical pulse stretchers of second optical pulse stretcher 401b which is positioned vertically in the figure. According to some embodiments, second optical pulse stretcher 401b is designed such that it provides additional optical delay.

According to some embodiments, the extended optical pulse stretcher 401 combines two or more confocal optical pulse stretchers. For example, extended optical pulse stretcher 401 combines confocal optical pulse stretchers in the combination of 4 reflections, 4 reflections, 12 reflections, and 12 reflections per optical circuit configuration. According to some embodiments, the inclusion of the combination of different mirror separations and delay path lengths (e.g., 4 reflections and 12 reflections delay lengths) can result in very long pulse stretching and minimal efficiency losses.

According to some embodiments, second optical pulse stretcher 401b can include three stages of confocal optical pulse stretchers. However, the embodiments of this disclosure are not limited to these examples, and second optical pulse stretcher 401b can include other numbers of stages of confocal optical pulse stretchers. In some examples, the first stage of second optical pulse stretcher 401b is discussed as having two mirrors. However, the embodiments of this disclosure are not limited to these examples and the first stage of second optical pulse stretcher 401b can include other numbers (for example two or more) and/or configurations of mirrors. In some examples, the plurality of mirrors used in the first stage of second optical pulse stretcher 401b are configured to generate four reflections of the laser beam between them.

In some examples, the second stage of second optical pulse stretcher 401b is discussed as having four mirrors. However, the embodiments of this disclosure are not limited to these examples and the second stage of second optical pulse stretcher 401b can include other numbers (for example four or more) and/or configurations of mirrors. In some examples, the plurality of mirrors used in the second stage of second optical pulse stretcher 401b are configured to generate twelve reflections of the laser beam between them.

In some examples, the third stage of second optical pulse stretcher 401b is discussed as having four mirrors. However, the embodiments of this disclosure are not limited to these examples and the third stage of second optical pulse stretcher 401b can include other numbers (for example four or more) and/or configurations of mirrors. In some examples, the plurality of mirrors used in the third stage of second optical pulse stretcher 401b are configured to generate twelve reflections of the laser beam between them.

According to some embodiments, first optical pulse stretcher 401a and the stages of second optical pulse stretcher 401b are designed such that optical delay increases from first optical pulse stretcher 401a to second optical pulse stretcher 401b. Also, the optical delay of each stage of second optical pulse stretcher 401b increases from the first to the third stage. For example, first optical pulse stretcher 401a (e.g., the orthogonal optical pulse stretcher) can have an optical delay. The first stage of second optical pulse stretcher 401b can have a first optical delay equal to or greater than the optical delay of first optical pulse stretcher 401a. The second stage of second optical pulse stretcher 401b can have a second optical delay equal to or greater than the first optical delay. The third stage of second optical pulse stretcher 401b can have a third optical delay equal to or greater than the second optical delay. According to some embodiments, the optical delay can be determined based on the distance that the beam travels within an optical pulse stretcher.

According to some embodiments, a first stage of second optical pulse stretcher 401b can have an optical design including two mirrors (e.g., two lower mirrors of mirrors 501 and 502 in FIG. 3) that produce four reflections of the laser beam between them. Although this example is discussed with two mirrors, the first stage of second optical pulse stretcher 401b can include other numbers of mirrors (for example, two or more mirrors). These mirrors can be positioned to generate four reflections of the laser beam between them. In some embodiments, the two mirrors of the first stage of second optical pulse stretcher 401*b* can be separated from each other by a physical distance of about 2 m-4 m. For example, the physical distance can be about 2.5 m to 3.5 m. These distances are provided by way of example only and other distances can be used in other embodiments. In some examples, the first stage of second optical pulse stretcher 401*b* can be capable of optical pulse stretching having, from example, an optical delay of about 60 ns-80 ns. For example, an optical delay of about 65 ns-75 ns. For example, an optical delay of about 70 ns-75 ns. It is noted that the example physical distance between the two mirrors and the example optical delays provided do not limit the embodiments of this disclosure. The first stage of second optical pulse stretcher 401*b* can be designed such that various other physical distances and/or various optical delays are achieved.

According to some embodiments, mirrors (e.g., the two lower mirrors of mirrors 501 and 502) of the first stage of second optical pulse stretcher 401*b* can include rectangular concave mirrors. For example, two large rectangular concave mirrors can be used but in other embodiments other shapes are used. According to some embodiments, the reflective surface of the mirrors can be spherically concave such that the distance between the two mirrors (e.g., the surfaces of the two lower mirrors of mirrors 501 and 502) of the first stage of second optical pulse stretcher 401*b* is equal to (or about equal to) the radius of the curvature of each of the two mirrors. For example, the mirrors can be designed and positioned based on a telecentric design. The concave mirrors can be designed with orthogonal tip-tilt adjustment and also Z-axis (e.g., the direction of the propagation of beam) adjustment, according to some embodiments.

According to some embodiments, the first stage of second optical pulse stretcher 401*b* can include additional optical elements. In one example, the first stage of second optical pulse stretcher 401*b* can include a beam splitter used to split the laser beam and to generate copies of the laser beam. The beam splitter of the first stage of second optical pulse stretcher 401*b* can have a reflectivity of, for example, about 45%-65%. In some examples, the beam splitter can have a reflectivity of about 50%-60%. But the embodiments of this disclosure are not limited to these examples and various other values of reflectivity can be used. In some examples, the reflectivity of the beam splitter can depend on and/or be calculated based on the reflectivity of the mirrors used in the first stage of second optical pulse stretcher 401*b*.

According to some embodiments, a second stage of second optical pulse stretcher 401*b* can have an optical design including four mirrors (e.g., four middle mirrors of mirrors 501 and 502 in FIG. 3) that produce 12 reflections of the laser beam between them. Although this example is discussed with four mirrors, the second stage of second optical pulse stretcher 401*b* can include other numbers of mirrors (for example, four or more mirrors). These mirrors can be positioned to generate twelve reflections of the laser beam between them. In some embodiments, the two pairs of mirrors of the second stage of second optical pulse stretcher 401*b* can be separated from each other by a physical distance of about 2 m-4 m. For example, the physical distance can be about 2.5 m to 3.5 m. These distances are provided by way of example only and other distances can be used in other embodiments. In some examples, the second stage of second optical pulse stretcher 401*b* can be capable of optical pulse stretching having, from example, an optical delay of about 170 ns-210 ns. For example, an optical delay of about 180 ns-190 ns. For example, an optical delay of about 185 ns-195 ns. It is noted that the example physical distance between the two pairs of mirrors and the example optical delays provided do not limit the embodiments of this disclosure. The second stage of second optical pulse stretcher 401*b* can be designed such that various other physical distances and/or various optical delays are achieved.

According to some embodiments, mirrors (e.g., the four middle mirrors of mirrors 501 and 502) of the second stage of second optical pulse stretcher 401*b* can include rectangular concave mirrors. For example, four large rectangular concave mirrors can be used but in other embodiments other shapes are used. According to some embodiments, the reflective surface of the mirrors can be spherically concave such that the distance between the two pairs of mirrors (e.g., the surfaces of the two pairs of middle mirrors of mirrors 501 and 502) of the second stage of second optical pulse stretcher 401*b* is equal to (or about equal to) the radius of the curvature of each of the four mirrors. For example, the mirrors can be designed and positioned based on a telecentric design. The concave mirrors can be designed with orthogonal tip-tilt adjustment, according to some embodiments.

According to some embodiments, the second stage of second optical pulse stretcher 401*b* can include additional optical elements. In one example, the second stage of second optical pulse stretcher 401*b* can include a beam splitter (middle beam splitter of beam splitters 503 of FIG. 3) used to split the laser beam and to generate copies of the laser beam. The beam splitter of the second stage of second optical pulse stretcher 401*b* can have a reflectivity of, for example, about 45%-65%. In some examples, the beam splitter can have a reflectivity of about 50%-60%. But the embodiments of this disclosure are not limited to these examples and various other values of reflectivity can be used. In some examples, the reflectivity of the beam splitter can depend on and/or be calculated based on the reflectivity of the mirrors used in the second stage of second optical pulse stretcher 401*b*.

Other details concerning optical pulse stretchers can be obtained from U.S. Pat. No. 7,369,597, titled "Laser Output Light Pulse Stretcher", issued May 6, 2008, the entire contents of which are hereby incorporated by reference.

Figure 4:
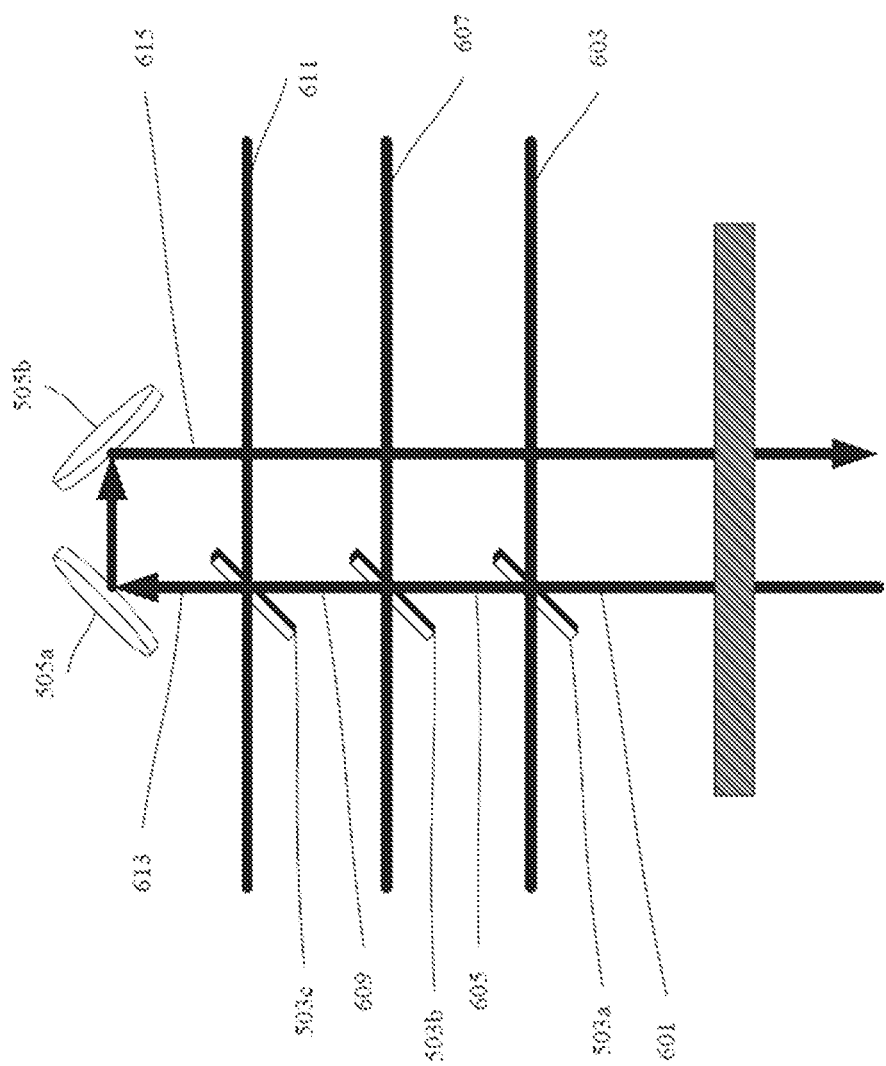
FIG. 4 is a diagram showing various light paths within an optical pulse stretcher according to an aspect of the disclosed subject matter.

FIG. 4 illustrates a schematic view of part of the paths of laser beams in second optical pulse stretcher 401*b*, according to some embodiments of the present disclosure.

Figure 5A:
FIGS. 5A and 5B are diagrams showing various light paths within an optical pulse stretcher according to an aspect of the disclosed subject matter.

As illustrated in FIG. 4, laser beam 601, which is optically stretched using the stage of first optical pulse stretcher 401*a* enters second optical pulse stretcher 401*b*. Using first beam splitter 503*a*, laser beam 601 is split into laser beam 603 and laser beam 605. Laser beam 605 enters the second stage of second optical pulse stretcher 401*b*. Laser beam 603 enters the first stage of second optical pulse stretcher 401*b*, which includes two mirrors. After four reflections from the two mirrors 501*a*, 502*a* of the first stage of second optical pulse stretcher 401*b* as shown in FIG. 5A, part of the laser beam enters the second stage of second optical pulse stretcher 401*b* by reflecting off beam splitter 503*a*, the rest of beam will continue to further loops inside the optical pulse stretcher 400.

Figure 5B:
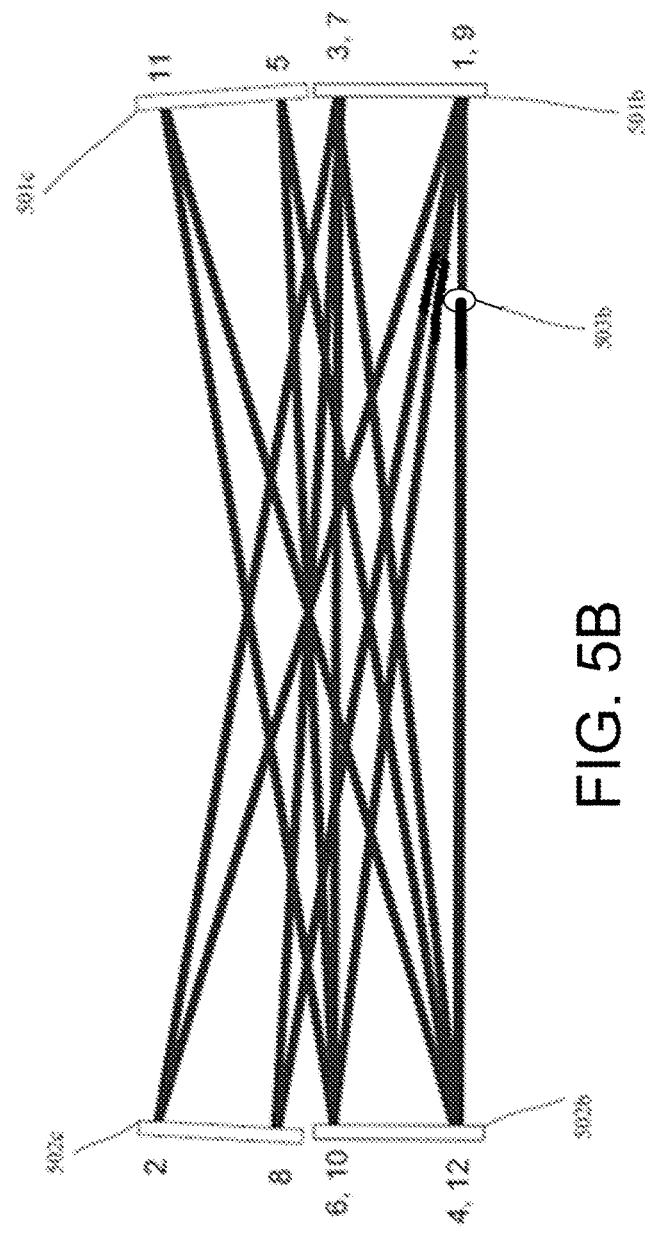

Laser beam 605 (and/or the laser beam from the first stage of second optical pulse stretcher 401*b*) is split into laser beam 607 and laser beam 609. Laser beam 609 enters the third stage of second optical pulse stretcher 401*b*. Laser beam 607 enters the second stage of second optical pulse stretcher 401*b*, which includes four mirrors 501*c*, 501*b*, 502*b*, and 501*c* as shown in FIG. 5B. After twelve reflections from the four mirrors, as indicated by the numbers 1-12, of the second stage of second optical pulse stretcher 401b part of the laser beam enters the third stage of enters second optical pulse stretcher 401b by reflecting off beam splitter 503b.

Laser beam 609 (and/or the laser beam from the second stage of the second optical pulse stretcher 401b) is split into laser beam 611 and laser beam 613. Laser beam 613 is reflected using mirrors 505a and 505b back to first optical pulse stretcher 401a. Laser beam 611 enters the third stage of second optical pulse stretcher 401b, which includes four mirrors. After twelve reflections from the four mirrors of the third stage of second optical pulse stretcher 401b, part of the laser beam is reflected toward first optical pulse stretcher 401a using beam splitter 503c and fold mirrors 505a and 505b (FIG. 4).

Figure 6:
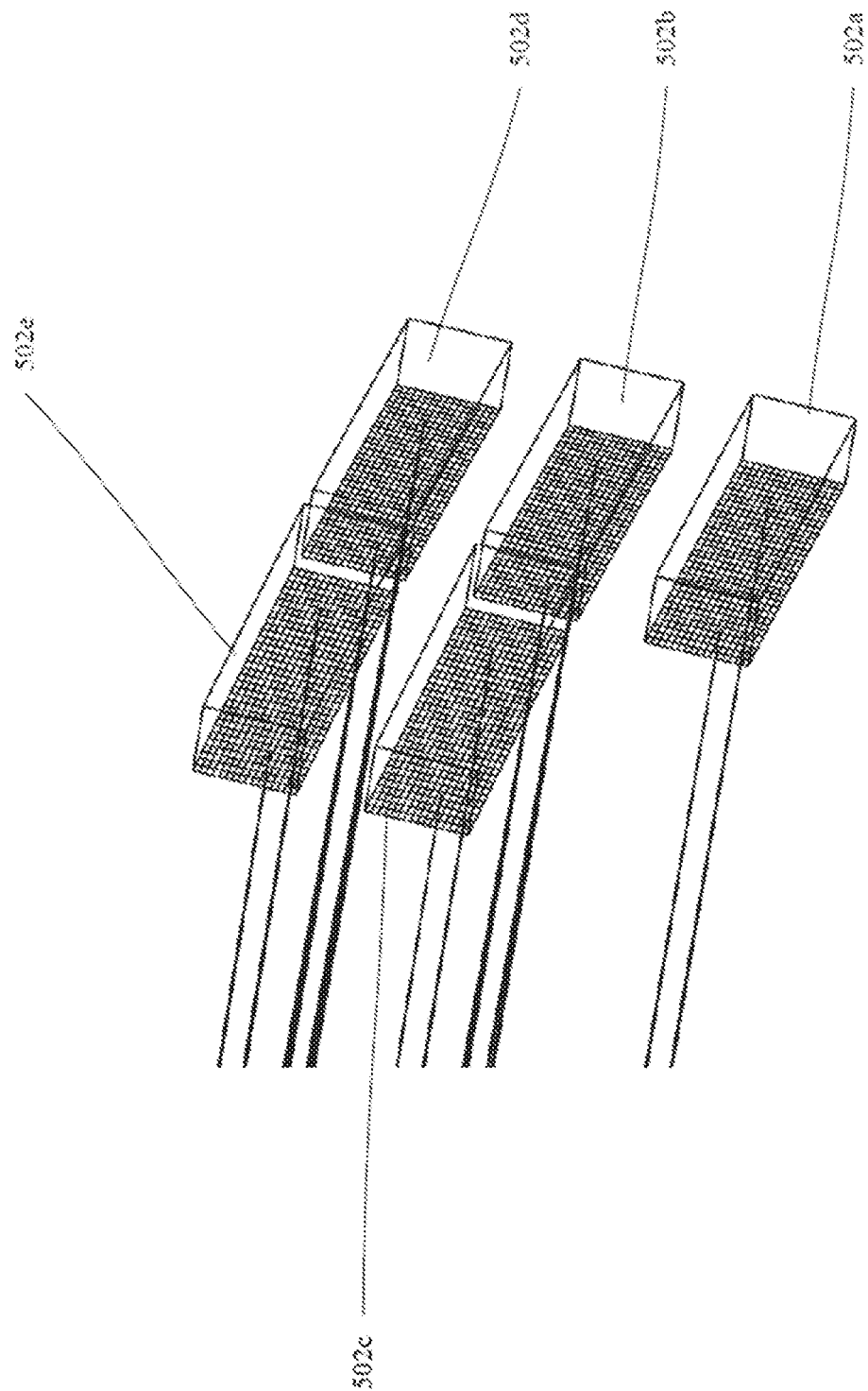
FIG. 6 is a partially perspective view of the arrangement of mirrors in one side of an optical pulse stretcher according to an aspect of the disclosed subject matter.

FIG. 6 illustrates a schematic view of part of the paths of laser beams in second optical pulse stretcher 401b and parts of mirrors used in second optical pulse stretcher 401b, according to some embodiments of the present disclosure.

In FIG. 6, the five mirrors on one side of second optical pulse stretcher 401b are illustrated. It will be understood that according to some embodiments an almost symmetric arrangement is also present in the second optical pulse stretcher 401b. In this example, mirror 502a of the first stage of second optical pulse stretcher 401b is illustrated. A mirror (e.g., mirror 501a) is on the other side of the first stage of second optical pulse stretcher 401b, which is not illustrated in this view. In this example, one pair of mirrors 502b and 502c of the second stage of second optical pulse stretcher 401b is illustrated. Another pair of mirrors (e.g., a pair of mirrors 501b and 501c) is on the other side of the second stage of second optical pulse stretcher 401b, which is not illustrated in this view. Also, in this example, one pair of mirror 502d and 502e of the third stage of second optical pulse stretcher 401b is illustrated. Another pair of mirrors (e.g., a pair of mirrors 501d and 501e) is on the other side of the third stage of second optical pulse stretcher 401b, which is not illustrated in this view.

The following discussion is in terms of an arrangement in which the optical components within the OPuS such as mirrors are arranged in two banks which are almost left-right symmetric with respect to a central axis for the sake of having a concrete example to expedite explanation. It will be appreciated, however, that the principles elucidated herein may be applicable to other arrangements so that the specific examples described herein are not limiting. As sued herein, "almost symmetric" and "substantially symmetric" mean sufficiently symmetric that the OpuS can function for its intended purpose and an image integration module as described below can "see" all of the mirrors simultaneously. According to aspects of an embodiment, in such an arrangement an image integration module is arranged to collect object rays from both the left side optics and right side optics, which is this example are concave mirrors. Thus, in this arrangement, there are several right-left mirror pairs. A camera system including a camera and a lens system is positioned outside the sealed OPuS enclosure. The camera is arranged to collect rays through a sealing window which is transparent to light in the visible portion of the spectrum, that is, in the range of wavelengths from about 380 to about 700 nm. The rays produce an image with half of the image originating from left side concave mirror of a mirror pair and the other half of the image originating from the right side concave mirror of the mirror pair.

Figure 7:
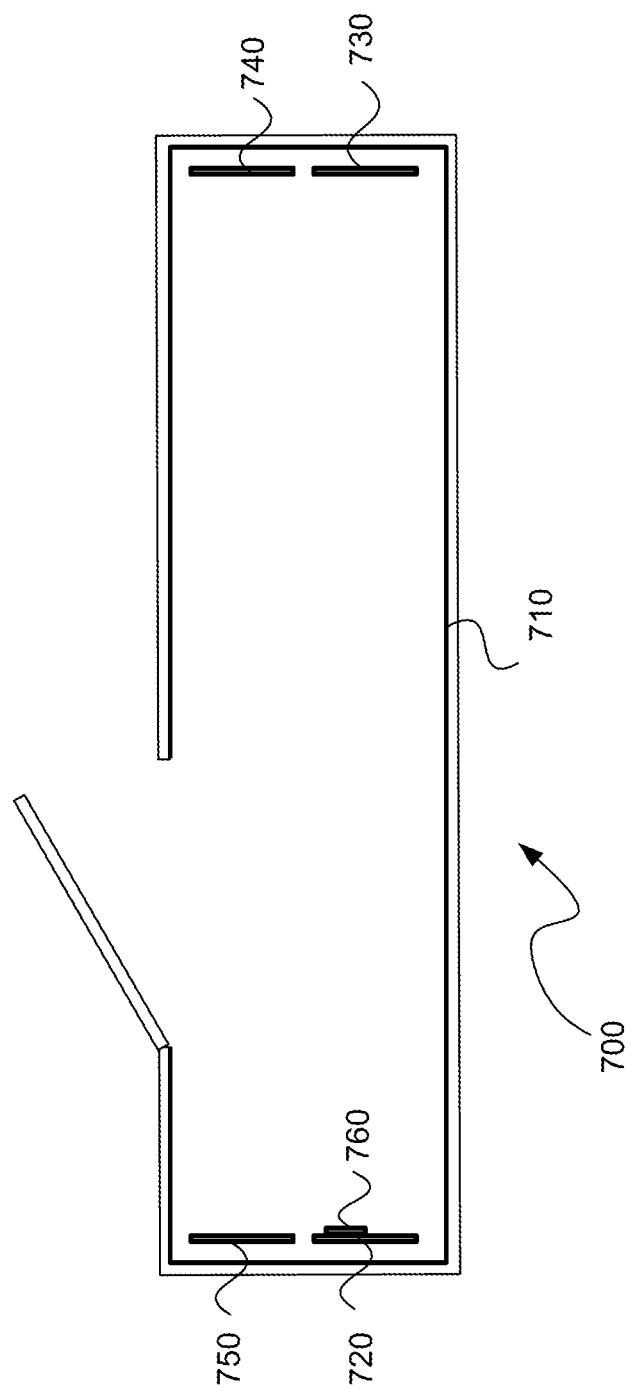
FIG. 7 is a diagram showing a conventional method of aligning optical features within an optical component.

Against this backdrop, the conventional method of aligning the optical elements in an OPuS is described in connection with FIG. 7. As seen in FIG. 7, an OPuS 700 includes an enclosure 710. Within the enclosure 710 are positioned for optical elements 720, 730, 740, and 750. These optical elements may be, for example, mirrors. These optical elements must be aligned so that an incoming beam strikes the optical elements at the proper position. To perform this alignment procedure, the enclosure 710 is opened and an alignment card 760 is placed adjacent to the position of the optical surface of one of the optical elements, in the figure, optical element 750. The optical element is then aligned so that the beam falls on the proper position on the alignment card 760. As set forth above, this method entails several disadvantages such as the need to open the enclosure 710 and break purge and the need for an operator to insert their hands into the enclosure 710 in an open beam situation, which can expose the operator's hands to ultraviolet radiation. It also increases the risk of optical contamination and the resultant decrease in the useful lifetime of the optics.

Figure 8A:
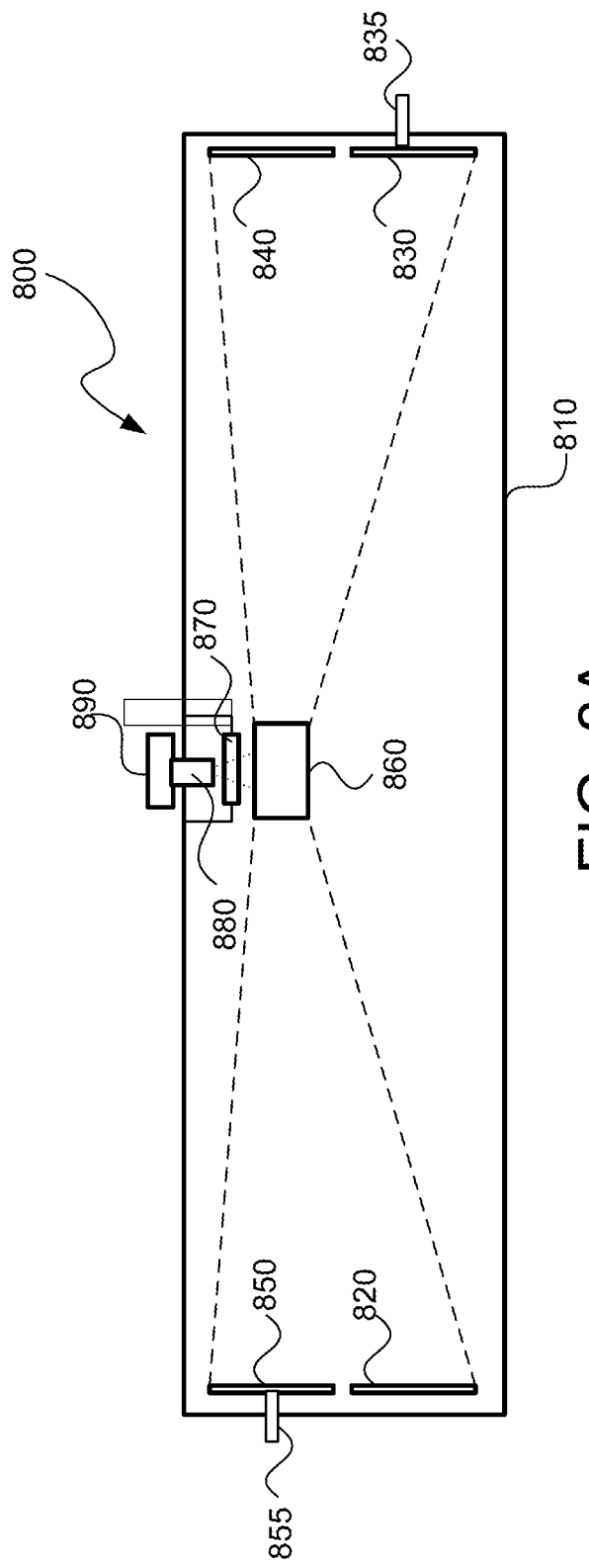

According to an aspect of an embodiment, as shown in FIG. 8A, an OPuS 800 enabling an improved method of alignment includes enclosure 810. Located within the enclosure 810 are optical features 820, 830, 840, and 850. Located in a central portion of the enclosure 810 is an image integration module 860. As will be described in further detail below, this image integration module 860 collects light from the optical features and presents the light to a camera 890 through a sealing window 870 and a lens 880. In effect, the camera 890 "sees" all of the optical features within the enclosure 810 at the same time without any need to open the enclosure 810. This permits continuous observation of the alignment state of the OPuS 800 while avoiding the disadvantages of the prior methods. In some embodiments, the image integration module 860 is placed as closely to the camera system as possible to maximize the available field of view. Elements 835 and 855 are adjustors as will be explained in more detail below. FIG. 8B shows the placement of the image integration module 860 in relation to the arrangement shown in FIG. 5B. Again, the numbers 1-12 indicate the positions of the twelve reflections from the four mirrors.

Figure 9A:
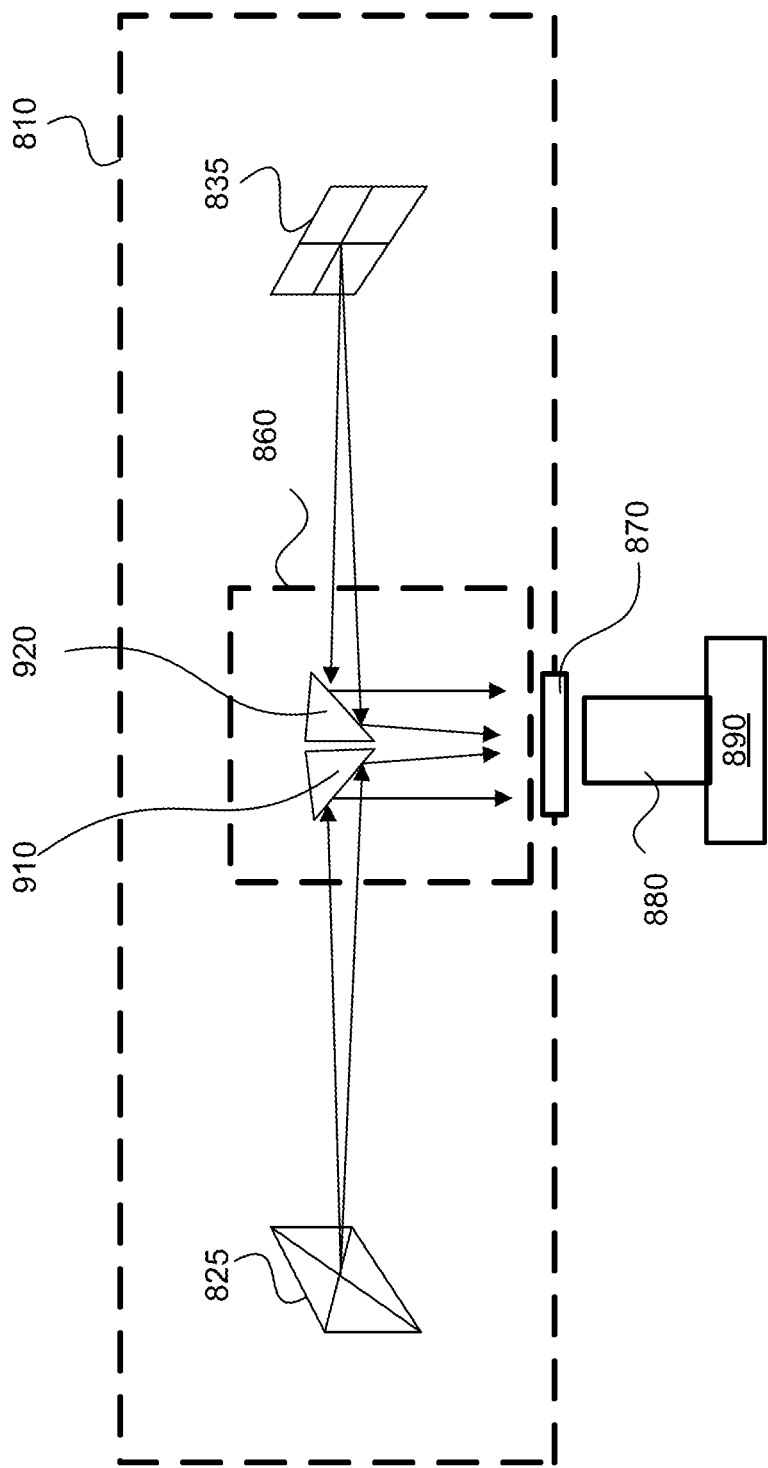
FIG. 9A is a diagram showing a system for aligning optical features according to an aspect of the disclosed subject matter.

FIG. 9A shows a possible implementation of the image integration module 860 according to an aspect of an embodiment. As shown, the image integration module 860 may be implemented as a pair of mirrored prisms 910, 920. The prism 910 is arranged receive light from a region of interest 825 including at least one optical feature 820 and redirect the light as shown out through the sealing window 870. Similarly, the prism 920 is arranged to receive light from a region of interest 835 and redirect the light as shown through the sealing window 870. Thus, a camera system including a camera and one or more lenses placed on the other side of the sealing window 870 simultaneously receives image-forming light from both the left side region of interest 825 and right side region of interest 835. In other words, the image integration module 860 collects object rays from both left side optical feature and the right side optical feature. A camera and lens system positioned outside the sealed OPuS enclosure 820 camera collects the object rays through the visible transparent sealing window and produces an image, half of the image being from left side optical feature and the other half being from right side optical feature.

FIG. 9B is a diagram showing the manner in which the image integration module 860 receives light from both the left side region of interest 825 containing at least one optical feature and right side region of interest 835 containing at least one optical feature and redirects the light to a position A from which a virtual object 825a which is an image of the left side region of interest 825 and from which a virtual object 835a which is an image of the right side region of interest 835 appear to be collocated, that is, positioned side-by-side, so that they can be viewed simultaneously by a single camera system placed at position A.

Figure 10:
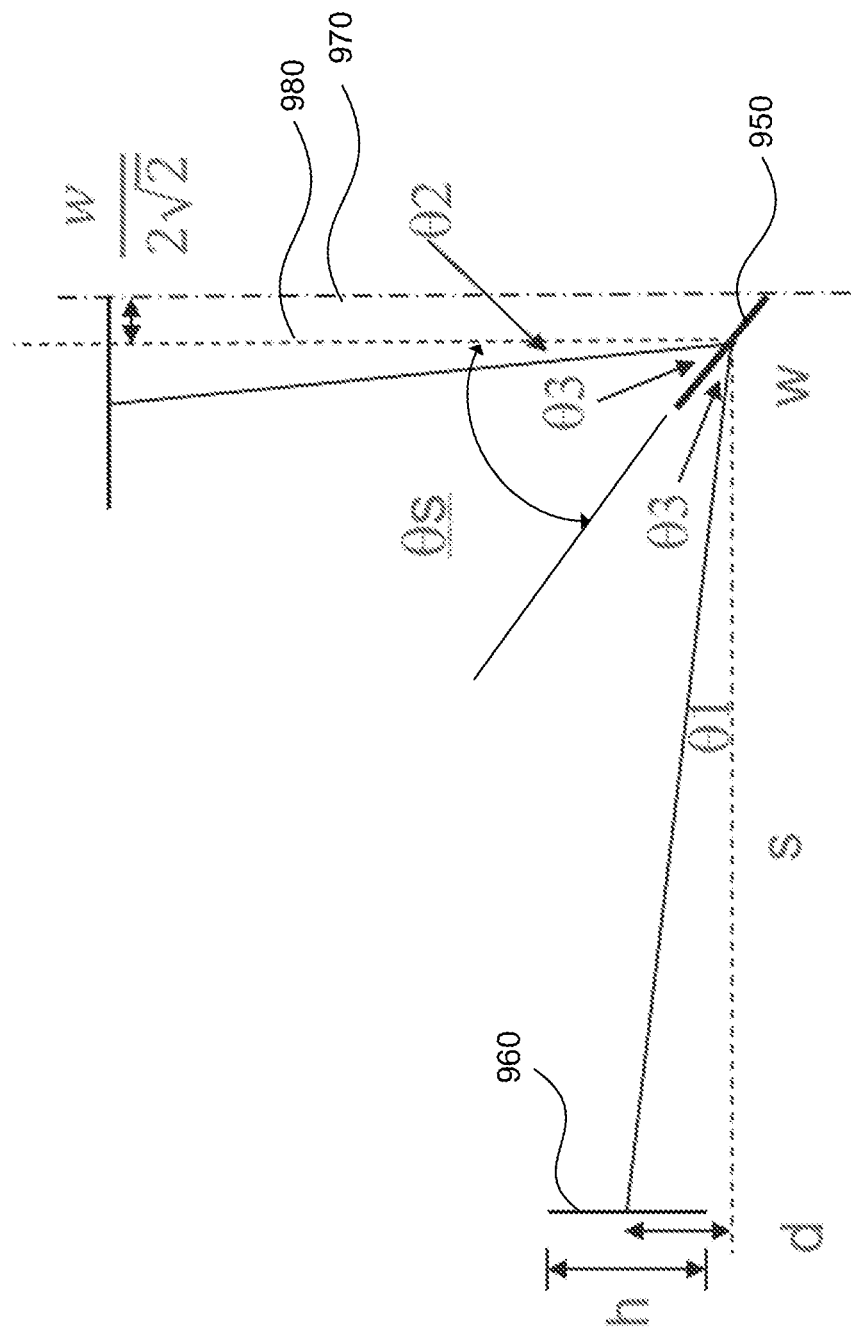
FIG. 10 is a diagram illustrating the conditions for achieving maximal field of view according to an aspect of the disclosed subject matter.

According to an aspect of an embodiment, the image integration module 860 may also be implemented using a pair of mirrored surfaces. As an example, a mirror 950, is shown in FIG. 10, the other mirror being placed substantially symmetrically across axis 970. The conditions for a maximal field of view in such an arrangement are established geometrically also as shown in FIG. 10. In the figure, h is the height of the field of interest 960, d is the vertical distance between the center of the field to the center of the mirror 950, and s is the horizontal distance between the field and the mirror 950. The upper part of the figure is the position of a virtual image viewed from below (in the figure) mirror. The angle θs for a maximal field of view between a line 980 parallel to the field of interest 960 and passing through a center of the mirror 950 is then given by the relationships:

$$\theta 1 = a\tan\left(\frac{d}{s}\right)$$

$$\theta 2 = a\tan\left[\frac{\frac{h}{2} - \frac{w}{2\sqrt{2}}}{s}\right]$$

$$\theta 3 = \frac{90 - \theta 1 - \theta 2}{2}$$

so that the angle θs, which is the angle of inclination of the mirror 950 with respect to the optical vertical is given by $$\theta s = \theta 2 + \theta 3 = \frac{90 - \theta 1 - \theta 2}{2} = 45 + \left[a\tan\left[\frac{\frac{h}{2} - \frac{w}{2\sqrt{2}}}{s}\right] - a\tan\left(\frac{d}{s}\right)\right]/2$$

Figure 11A:
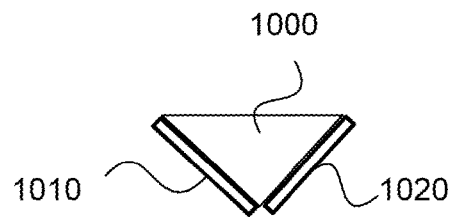
FIGS. 11A and 11B show alternative components for an image integration module according to an aspect of the disclosed subject matter.
Figure 11B:
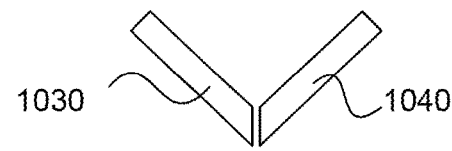
Figure 11C:
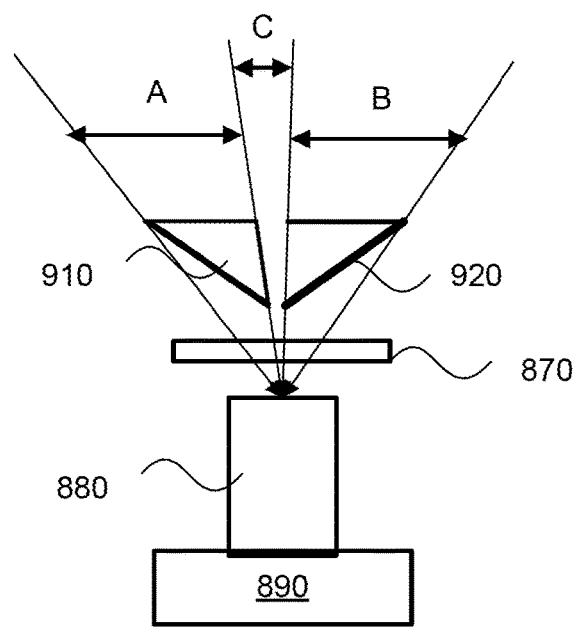
FIG. 11C is a diagram showing the effects of placement of components within the optical image integration module on field of view according to an aspect of the disclosed subject matter.

As mentioned, the image integration module 860 may be implemented in any one of a number of ways. According to aspects of some embodiments, the image integration module 860 may be implemented as a pair of prisms 910, 920 as shown in FIG. 9A, or as a single prism 1000 with two mirrored surfaces 1010 and 1020 as shown in FIG. 11A, or as two flat beveled mirrors 1030 and 1040 as shown in FIG. 11B. However, the image integration module 860 is implemented, in some embodiments the gap between the optical elements or mirrored surfaces is minimized so as not to waste the portion of the field of view lost to gaps as depicted in FIG. 11C. In FIG. 11C the arrow A depicts the field of view from one of the optical features, e.g., mirror and the arrow B depicts the field of view from the other, paired optical feature, and the arrow C depicts the field of view lost due to the gap between the prisms 910, 920.

Figure 12A:
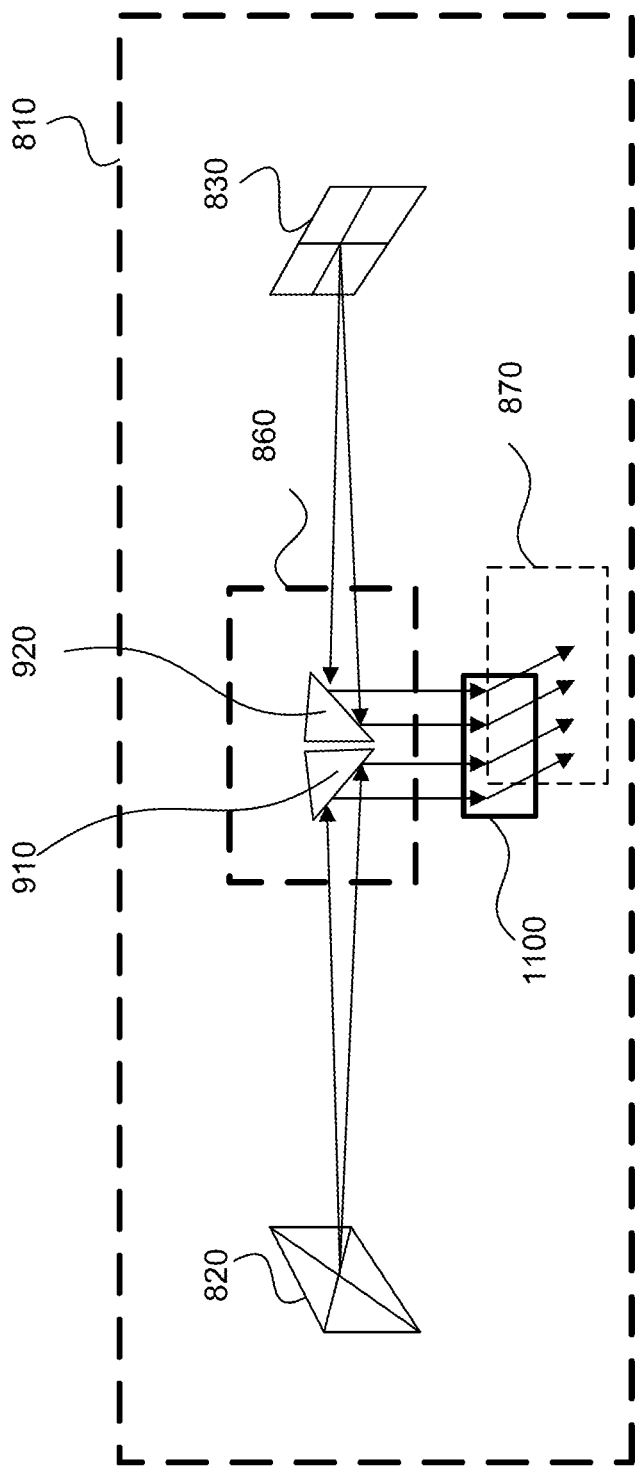
FIG. 12A is a diagram showing a system for aligning optical features according to an aspect of the disclosed subject matter.
Figure 12B:
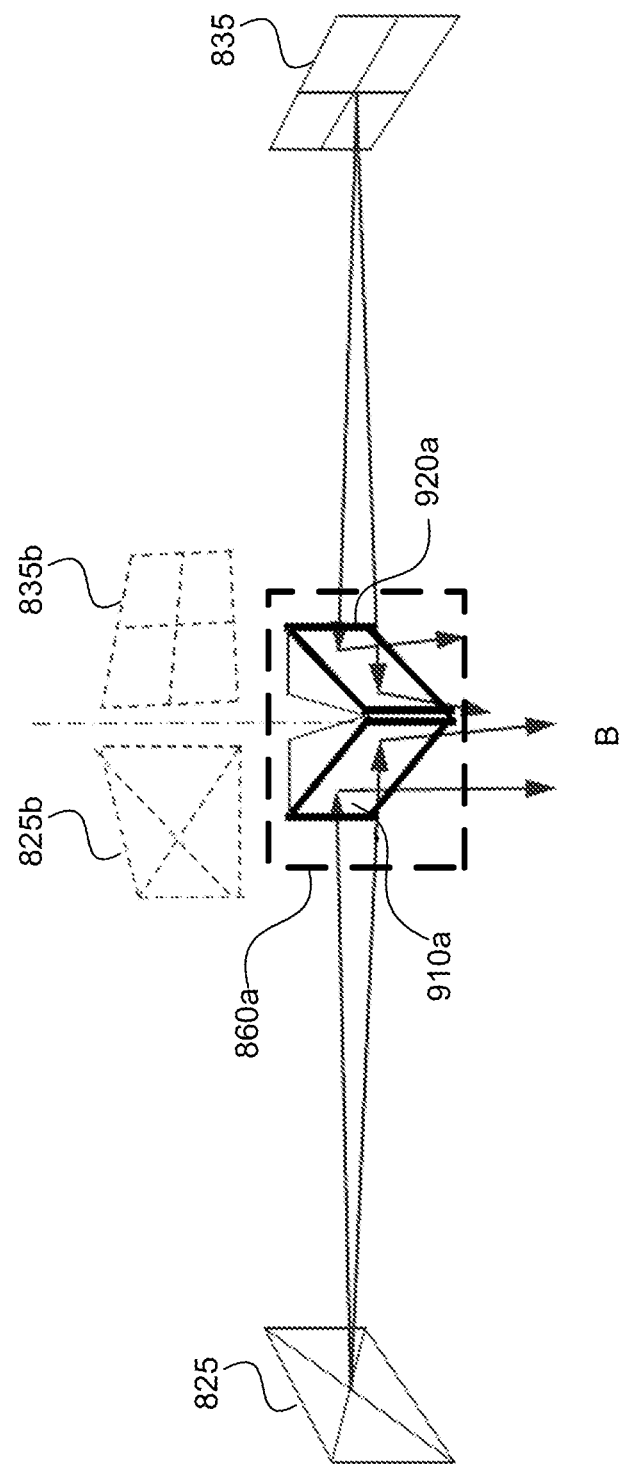
FIG. 12B is a diagram showing image collocation in a system for aligning optical features according to an aspect of the disclosed subject matter.

FIG. 9A depicts an arrangement in which the light passing through the sealing window 870 travels directly in a straight line to the lens system 880. For some embodiments it may be advantageous to interpose additional optical elements in the path from the sealing window 870 to the lens system 880. For example, FIG. 12A shows an arrangement in which a folding mirror 1100 is placed in this path to fold the optical path and create the possibility of providing more compact arrangements. In the arrangement in FIG. 12A the mirror 1100 is positioned within the enclosure to obtain a larger field of view. This arrangement also provides the ability to adjust the image orientation and improve matching of the size and shape of the field and the image sensor in the camera. FIG. 12B shows an arrangement in which the prisms 910a, 920a are partially rotated to fold the optical path. FIG. 12B shows the manner in which the image integration module 860a receives light from both the left side region of interest 825 and right side region of interest 835 and redirects the light to a position B from which a virtual object 825b which is an image of the left side region of interest 825 and from which a virtual object 835b which is an image of the right side region of interest 835 appear to be collocated, that is, positioned side-by-side, so that they can be viewed simultaneously by a single camera system placed at position B. As shown, this arrangement also provides the ability to adjust the image orientation and improve matching of the size and shape of the field and the image sensor in the camera.

For some embodiments it may also be advantageous to enhance the visibility of the region of interest by providing an alignment feature and by using visible (to the camera) light from fluorescence produced by absorption of ultraviolet light. Using the example of a dichroic mirror as the optical element to be aligned, the mirror in general is supported by a mirror supporting plate 1300 which includes a support 1310 and at least one alignment feature 1320. According to some embodiments, as shown in FIG. 13, a dichroic mirror assembly 1330 includes a substrate 1340 which transmits visible light as shown in FIG. 13B and a UV reflective coating 1360 (FIG. 13D). The dichroic mirror assembly 1330 is overlaid on top of the mirror supporting plate 1300 to produce the sandwich-like structure shown in FIGS. 13C and 13D. UV radiation striking the dichroic mirror assembly 1330 will create a visible beam fluorescence footprint 1350 in a manner described more fully below. The fluorescence generated by the ultraviolet radiation and the back alignment feature can be observed by the camera operating in, for example, the visible spectrum range. By comparing the location of the fluorescence and the alignment feature through the mirror or substrate the system can easily be aligned as described below. While visible light is used in this example, it will be understood that radiation outside of the visible portion of the spectrum may be used.

Figure 14A:
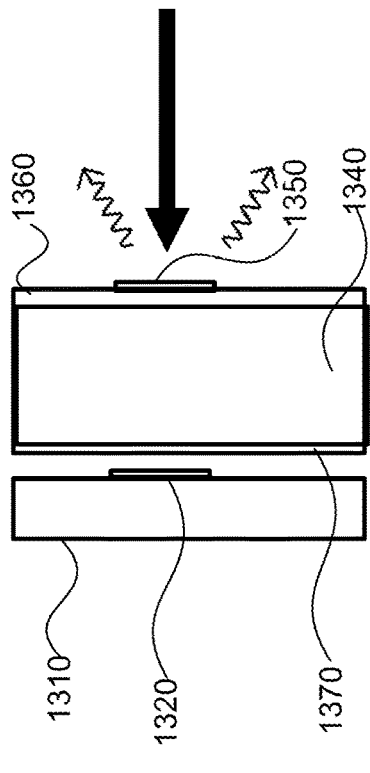
FIGS. 14A, 14B, 14C, and 14D show aspects of the structure of optical features according to aspects of the disclosed subject matter.
Figure 14B:
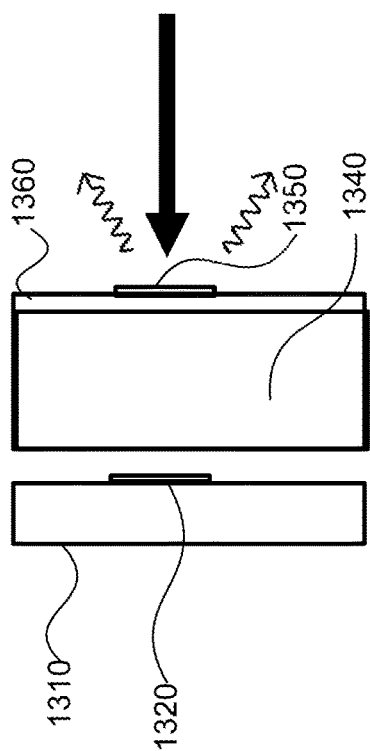
Figure 14C:
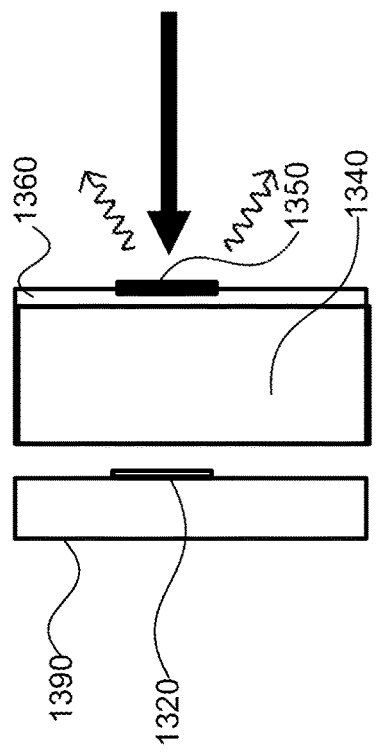
Figure 14D:
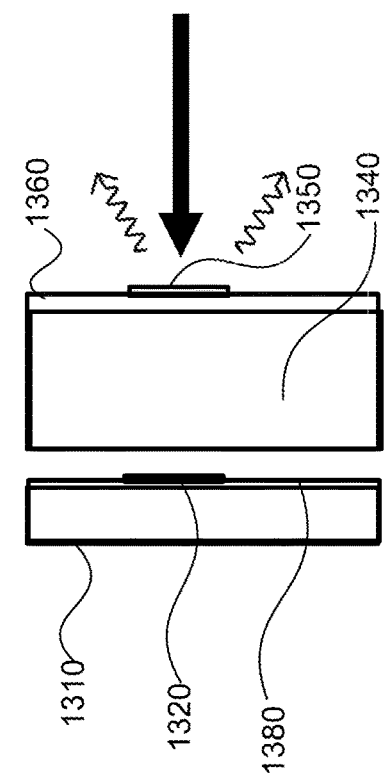

According to aspects of various embodiments, the illuminated beam footprint may be generated on exposure to UV in any one of a number of different ways. For example, as shown in FIG. 14A, the UV reflective coating 1360 may be selected to be one that exhibits intrinsic fluorescence properties upon exposure to UV. This is indicated in FIGS. 14A-14D with the thick arrow indicating incident UV radiation and the wavy arrows indicating light produced by fluorescence. Alternatively, as shown in FIG. 14B, a back surface of the substrate 1340 may be provided with a fluorescent coating 1370 with light being generated by leakage of UV through the reflective coating 1360. The term "back surface" when referring to the substrate 1340 means the substrate surface that faces away from the incoming UV radiation. Alternatively, as shown in FIG. 14C, a front surface of the support 1310 may be provided with a fluorescent coating 1380 with light being generated by leakage of UV through the reflective coating 1360. The term "front surface" when referring to the support 1310 means the support surface that faces in the direction of incoming UV radiation. Alternatively, as shown in FIG. 14D, the support 1310 may be made of a fluorescent material with light being generated by leakage of UV through the reflective coating 1360.

FIG. 15A is a plan view of dichroic mirror assembly 1330 overlaid on top of the mirror supporting plate 1300 with alignment feature 1320. The mirror supporting plate 1300 with alignment feature 1320 are shown in phantom as they are behind the dichroic mirror assembly 1330. UV radiation striking the dichroic mirror assembly 1330 creates a visible beam fluorescence footprint 1350 as described. In other words, the UV radiation beam will strike the dichroic mirror assembly 1330 at one or more specific locations as shown, for example, in FIG. 5B. The specific area struck by the beam will fluoresce as indicated by the fluorescence footprint 1350. The rest of the surface of the dichroic mirror assembly 1330 not struck by the beam will not fluoresce. FIG. 15A shows an unaligned position in which the fluorescence footprint 1350 does not sufficiently coincide with the alignment feature 1320. FIG. 15B shows an aligned position in which the fluorescence footprint 1350 does sufficiently coincide with the alignment feature 1320. This is accomplished by alignment so that the UV beam lands on the dichroic mirror assembly 1330 in correct locations (two in the example) which due to fluorescence light up and reveal the relative positioning of the UV footprint and the alignment feature. To correct alignment, the orientation of one or more mirrors is adjusted so that the beam lands in the correct positions on all of the mirrors. The image of the beam landing juxtaposed with the alignment feature is captured by the camera, that is, converted to a digital image which an operator can view while performing an alignment operation.

According to some embodiments, the alignment of the pulse stretcher requires that at least some of the mirrors be adjustable, e.g., in the case of a four mirror arrangement, at least two of the four imaging relay mirrors be adjustable. Each of the two adjustable mirrors has tip/tilt adjustment creating a total of four degrees of freedom. The two adjustable mirrors may be located at opposite ends of the OPuS because of the confocal design of the system. The adjustable mirrors can also be designed with Z-axis (e.g., the direction of the propagation of beam) adjustment, according to some embodiments.

Typically, adjustments on these components to carry out alignment are made using a through-the-wall adjustor ("TWA") such as adjustors 855 and 835 (FIG. 8A). These involve the use of a hand-manipulated hex driver to tip or tilt or translate an optic or module. TWAs may provide a sealed mechanical feed through to certain adjustments, e.g., accessed through the covers via a sealed mechanical feedthrough. Adjustment can also be carried out with an electrically actuated TWA instead of a manually actuated TWA. A motor is mechanically coupled to the TWA. For example, the motor may have a shaft to which a hex adaptor is attached so that when the motor turns the shaft, the hex driver also turns, causing the end of the TWA to translate along its axis according to the direction of rotation of the shaft. Use of an electrically actuated TWA enables automation of the alignment process with the digital images from the camera 890 being conveyed to the control system 135 (FIG. 1) which in turn analyzes the images and actuates the TWAs to carry out alignment.

It should be understood that alignment may entail adjusting only one optical feature and that causing the beam to impinge on the proper part of a first optical feature may require adjusting a second optical feature optical feature FIG. 16 is a flow chart showing a process for aligning optical features positioned within a sealed enclosure in accordance with aspects of embodiments. In a step S10 the optical features within the enclosure are exposed to a beam of UV radiation. The beam of UV radiation makes the footprint of the UV radiation beam visible. In a step S20 the light generated by the UV radiation beam fluorescence is combined into a single image from the optical features. The single image is conveyed outside of the enclosed chamber to a camera in a step S30. In a step S40 the features are aligned based on the image made from the light combined from the features, either by a technician while viewing the image captured by the camera or by a control system as described above. In essence, in instances where each of the features includes an alignment feature, the alignment is determined based on the positional relationship within the image of the beam footprint and the alignment feature for each optical feature.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Other aspects of the invention are set out in the following numbered clauses:

1. An optical component comprising:
a sealed enclosure, the sealed enclosure including a window transparent to visible light;
a first optical feature positioned at a first position within the enclosure;
a second optical feature positioned at a second position within the enclosure; and
an image integration module arranged to receive first optical feature light from the first optical feature and second optical feature light from the second optical feature and adapted to redirect the first optical feature light and the second optical feature light through the window to form an image from the first optical feature light collocated with an image from the second optical feature light.

2. The optical component as in clause 1 wherein the optical component is an optical pulse stretcher.

3. The optical component as in clause 1 wherein the first optical feature comprises a first mirror and wherein the second optical feature comprises a second mirror.

4. The optical component as in clause 3 wherein the first mirror comprises a first concave dichroic mirror and wherein the second mirror comprises a second concave dichroic mirror.

5. The optical component as in clause 1 wherein the first optical feature and the second optical feature are positioned substantially symmetrically with respect to the image integration module.

6. The optical component as in clause 1 wherein the image integration module comprises a first reflective surface arranged to redirect light from the first optical feature and a second reflective surface arranged to redirect light from the second optical surface.

7. The optical component as in clause 6 wherein the first reflective surface comprises a first prism reflective surface of a first prism and wherein the second reflective surface comprises a second prism reflective surface of a second prism.

8. The optical component as in clause 1 wherein the image integration module comprises a prism having a first reflective surface oriented toward the first optical feature and a second reflective surface oriented toward the second optical feature.

9. The optical component as in clause 1 wherein the image integration module comprises two flat beveled mirrors.

10. The optical component as in clause 1 further comprising:
a third optical feature positioned at a third position within the enclosure; and
a fourth optical feature positioned at a fourth position within the enclosure;
wherein the image integration module is arranged to receive third optical feature light from the third optical feature and fourth optical feature light from the fourth optical feature and adapted to combine and redirect the third optical feature light and the fourth optical feature light through the window to form an image from the third optical feature light collocated with an image from the fourth optical feature light.

11. The optical component as in clause 1 further comprising a camera system arranged to receive the first optical feature light and the second optical feature light through the window.

12. The optical component as in clause 11 wherein the camera system comprises a lens system arranged to receive the first optical feature light and the second optical feature light through the window and a camera arranged to receive the first optical feature light and the second optical feature light from the lens system.

13. The optical component as in clause 11 further comprising a folding mirror optically positioned between the image integration module and the window for turning an optical path of the first optical feature light and the second optical feature light.

14. The optical component as in clause 1 wherein at least one of the first optical feature and the second optical feature is adjustable, and further comprising an actuator mechanically coupled to the at least one of the first optical feature and the second optical feature to adjust an orientation of the at least one of the first optical feature and the second optical feature.

15. The optical component as in clause 1 wherein the first optical feature comprises a first fluorescent material and a first alignment feature and wherein the second optical feature comprises a second fluorescent material and a second alignment feature.

16. The optical component as in clause 1 wherein the first optical feature comprises a first mirror comprising a first substrate transparent to visible light and first reflective coating that is reflective to UV radiation and a first mirror support, and wherein the second optical feature comprises a second mirror comprising a second substrate transparent to visible light and second reflective coating that is reflective to UV radiation and a second mirror support.

17. The optical component as in clause 16 wherein the first mirror support comprises a first alignment feature on a front surface of the first mirror support and wherein the second mirror support comprises a second alignment feature on a front surface of the second mirror support.

18. The optical component as in clause 17 wherein the first alignment feature corresponds to a position of an aligned beam footprint on the first mirror and wherein the second alignment feature corresponds to a position of an aligned beam footprint on the second mirror.

19. The optical component as in clause 18 wherein the first optical feature further comprises a first fluorescent material and wherein the second optical feature further comprises a second fluorescent material.

20. The optical component as in clause 19 wherein the first optical feature comprises a first reflective coating including the first fluorescent material and wherein the second optical feature comprises a second reflective coating including the second fluorescent material.

21. The optical component as in clause 19 wherein the first fluorescent material is provided on a back surface of the first substrate and wherein the second fluorescent material is provided on a back surface of the second substrate.

22. The optical component as in clause 19 wherein the first fluorescent material is provided on a front surface of the first mirror support and wherein the second fluorescent material is provided on a front surface of the second mirror support.

23. The optical component as in clause 19 wherein the first mirror support comprises the first fluorescent material and wherein the second mirror support comprises the second fluorescent material.

24. An optical component comprising:
a sealed enclosure, the sealed enclosure including a window transparent to visible light;
a first optical feature positioned within a first field of view within the enclosure;
a second optical feature positioned within the first field of view within the enclosure; and
an image integration module arranged to receive first field of view light from the first field of view and adapted to combine and redirect the first field of view light through the window, wherein the image integration module comprises a planar mirrored surface inclined with respect to a line passing through a center of the planar mirrored surface and substantially parallel to the first field of view by an angle θ given by the relationship $$\theta = 45 + \left[ atan\left[ \frac{\frac{h}{2} - \frac{w}{2\sqrt{2}}}{s} \right] - atan\left(\frac{d}{s}\right) \right] / 2.$$

where h is a height of the first field of view, d is a vertical distance between the center of the first field of view to the center of the planar mirrored surface, and s is a horizontal distance between the first field of view and the center of the planar mirrored surface.

25. A method of aligning a plurality of optical features arranged in sealed enclosure having a window, the method comprising:
combining light from each of the optical features to produce a combined light signal;
directing the combined light signal out of the enclosure through the window; and aligning at least some of the plurality of optical features based at least in part on the combined light signal.

26. The method as in clause 25 further comprising imaging the combined light signal after directing the combined light signal out of the enclosure through the window using a camera system positioned outside of the sealed enclosure and arranged to receive the combined light signal.

27. The method as in clause 25 wherein each of the plurality of optical features comprises an alignment feature and a fluorescent material arranged to generate a visible footprint of a UV beam impinging on the optical feature and further comprising, before combining light from each of the optical features to produce a combined light signal,
exposing each of the optical features to a beam of UV radiation, and
generating an illuminated footprint of the beam of UV radiation on each of the optical features, wherein aligning at least some of the plurality of optical features based at least in part on the combined light Signal comprises aligning at least some of the plurality of optical features based at least in part on a positional relationship of the illuminated footprint and the alignment feature for each optical feature.

28. The method as in clause 25 wherein aligning comprises adjusting one or more of the plurality of optical features.

29. The method as in clause 28 wherein adjusting one or more of the plurality of optical features comprises manually operating one or more actuators respectively mechanically coupled to the one or more of the plurality of optical features.

30. The method as in clause 28 wherein adjusting one or more of the plurality of optical features comprises supplying a signal to actuate one or more motor driven actuators respectively mechanically coupled to the one or more of the plurality of optical features.

31. The method as in clause 28 wherein adjusting one or more of the plurality of optical features comprises adjusting an orientation of one or more of the plurality of optical features.

The invention claimed is:

1. An optical pulse stretcher comprising:
   a sealed enclosure, the sealed enclosure including a window transparent to visible light;
   a first optical feature positioned at a first position within the enclosure;
   a second optical feature positioned at a second position within the enclosure; and
   an image integration module arranged to receive first optical feature light from the first optical feature and second optical feature light from the second optical feature and adapted to redirect the first optical feature light and the second optical feature light through the window to form an image from the first optical feature light collocated with an image from the second optical feature light.

2. The optical pulse stretcher as in claim 1 wherein the first optical feature comprises a first mirror and wherein the second optical feature comprises a second mirror.

3. The optical pulse stretcher as in claim 2 wherein the first mirror comprises a first concave dichroic mirror and wherein the second mirror comprises a second concave dichroic mirror.

4. The optical pulse stretcher as in claim 1 wherein the first optical feature and the second optical feature are positioned substantially symmetrically with respect to the image integration module.

5. The optical pulse stretcher as in claim 1 wherein the image integration module comprises a first reflective surface arranged to redirect light from the first optical feature and a second reflective surface arranged to redirect light from the second optical feature.

6. The optical pulse stretcher as in claim 5 wherein the first reflective surface comprises a first prism reflective surface of a first prism and wherein the second reflective surface comprises a second prism reflective surface of a second prism.

7. The optical pulse stretcher as in claim 1 wherein the image integration module comprises a prism having a first reflective surface oriented toward the first optical feature and a second reflective surface oriented toward the second optical feature.

8. The optical pulse stretcher as in claim 1 wherein the image integration module comprises two flat beveled mirrors.

9. The optical pulse stretcher as in claim 1 further comprising:
   a third optical feature positioned at a third position within the enclosure; and
   a fourth optical feature positioned at a fourth position within the enclosure;
   wherein the image integration module is arranged to receive third optical feature light from the third optical feature and fourth optical feature light from the fourth optical feature and adapted to combine and redirect the third optical feature light and the fourth optical feature light through the window to form an image from the third optical feature light collocated with an image from the fourth optical feature light.

10. The optical pulse stretcher as in claim 1 further comprising a camera system arranged to receive the first optical feature light and the second optical feature light through the window.

11. The optical pulse stretcher as in claim 10 wherein the camera system comprises
   a lens system arranged to receive the first optical feature light and the second optical feature light through the window and
   a camera arranged to receive the first optical feature light and the second optical feature light from the lens system.

12. The optical pulse stretcher as in claim 10 further comprising a folding mirror optically positioned between the image integration module and the window for turning an optical path of the first optical feature light and the second optical feature light.

13. The optical pulse stretcher as in claim 1 wherein at least one of the first optical feature and the second optical feature is adjustable, and further comprising an actuator mechanically coupled to the at least one of the first optical feature and the second optical feature to adjust an orientation of the at least one of the first optical feature and the second optical feature.

14. The optical pulse stretcher as in claim 1 wherein the first optical feature comprises a first fluorescent material and a first alignment feature and wherein the second optical feature comprises a second fluorescent material and a second alignment feature.

15. The optical pulse stretcher as in claim 1 wherein
   the first optical feature comprises a first mirror comprising
      a first substrate transparent to visible light and first reflective coating that is reflective to UV radiation and
      a first mirror support, and wherein
   the second optical feature comprises a second mirror comprising a second substrate transparent to visible light and second reflective coating that is reflective to UV radiation and a second mirror support.

16. The optical pulse stretcher as in claim 15 wherein the first mirror support comprises a first alignment feature on a front surface of the first mirror support and wherein the second mirror support comprises a second alignment feature on a front surface of the second mirror support.

17. The optical pulse stretcher as in claim 16 wherein the first alignment feature corresponds to a position of an aligned beam footprint on the first mirror and wherein the second alignment feature corresponds to a position of an aligned beam footprint on the second mirror.

18. The optical pulse stretcher as in claim 17 wherein the first optical feature further comprises a first fluorescent material and wherein the second optical feature further comprises a second fluorescent material.

19. The optical pulse stretcher as in claim 18 wherein the first optical feature comprises a first reflective coating including the first fluorescent material and wherein the second optical feature comprises a second reflective coating including the second fluorescent material.

20. The optical pulse stretcher as in claim 18 wherein the first fluorescent material is provided on a back surface of the first substrate and wherein the second fluorescent material is provided on a back surface of the second substrate.

21. The optical pulse stretcher as in claim 18 wherein the first fluorescent material is provided on a front surface of the first mirror support and wherein the second fluorescent material is provided on a front surface of the second mirror support.

22. The optical pulse stretcher as in claim 18 wherein the first mirror support comprises the first fluorescent material and wherein the second mirror support comprises the second fluorescent material.

* * * * *